(12) United States Patent
Jeng et al.

(10) Patent No.: US 12,100,666 B2
(45) Date of Patent: *Sep. 24, 2024

(54) METHOD FOR FORMING CHIP PACKAGE STRUCTURE

(71) Applicant: Taiwan Semiconductor Manufacturing Company, Ltd., Hsinchu (TW)

(72) Inventors: Shin-Puu Jeng, Hsinchu (TW); Techi Wong, Zhubei (TW); Po-Yao Lin, Zhudong Township, Hsinchu County (TW); Ming-Chih Yew, Hsinchu (TW); Po-Hao Tsai, Zhongli (TW); Po-Yao Chuang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/178,775

(22) Filed: Mar. 6, 2023

(65) Prior Publication Data

US 2023/0207477 A1    Jun. 29, 2023

Related U.S. Application Data

(60) Continuation of application No. 17/373,016, filed on Jul. 12, 2021, now Pat. No. 11,600,575, which is a
(Continued)

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/6835* (2013.01); *H01L 21/76885* (2013.01); *H01L 23/3128* (2013.01); *H01L 23/5386* (2013.01); *H01L 24/19* (2013.01); *H01L 24/20* (2013.01); *H01L 24/24* (2013.01); *H01L 25/105* (2013.01); *H01L 25/50* (2013.01); *H01L 2221/68345* (2013.01);
(Continued)

(58) Field of Classification Search
CPC ... H01L 2224/023–024; H01L 21/4846–4867; H01L 21/4807–481; H01L 2224/24145–24147; H01L 25/042; H01L 25/0655; H01L 25/072; H01L 25/0753; H01L 25/115; H01L 25/0652; H01L 25/071; H01L 25/112
See application file for complete search history.

(56) References Cited

U.S. PATENT DOCUMENTS 5,241,456 A    8/1993    Marcinkiewicz et al.
9,000,584 B2   4/2015    Lin et al.
(Continued)

*Primary Examiner* — Amar Movva
(74) *Attorney, Agent, or Firm* — Birch, Stewart, Kolasch & Birch, LLP

(57) ABSTRACT

A method for forming a chip package structure is provided. The method includes forming a conductive pad over a carrier substrate, forming a substrate layer over the carrier substrate, wherein the conductive pad is embedded in the substrate layer, forming a conductive pillar electrically connected to the conductive pad, disposing a chip in the substrate layer, and forming a molding layer surrounding the chip.

20 Claims, 26 Drawing Sheets

Related U.S. Application Data division of application No. 16/180,511, filed on Nov. 5, 2018, now Pat. No. 11,062,997.

(60) Provisional application No. 62/733,936, filed on Sep. 20, 2018.

(51) Int. Cl.
  *H01L 21/683* (2006.01)
  *H01L 21/768* (2006.01)
  *H01L 23/00* (2006.01)
  *H01L 23/31* (2006.01)
  *H01L 25/00* (2006.01)
  *H01L 25/10* (2006.01)

(52) U.S. Cl.
  CPC ............... *H01L 2221/68359* (2013.01); *H01L 2224/211* (2013.01); *H01L 2224/24145* (2013.01); *H01L 2225/1035* (2013.01); *H01L 2225/1041* (2013.01); *H01L 2225/1058* (2013.01)

(56) References Cited

U.S. PATENT DOCUMENTS

| | | |
|---|---|---|
| 9,048,222 B2 | 6/2015 | Hung et al. |
| 9,064,879 B2 | 6/2015 | Hung et al. |
| 9,048,233 B2 | 8/2015 | Wu et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,922,924 B1 | 3/2018 | Shih |
| 2009/0095521 A1 | 4/2009 | Yokouchi et al. |
| 2011/0285007 A1 | 11/2011 | Chi et al. |

METHOD FOR FORMING CHIP PACKAGE STRUCTURE

PRIORITY CLAIM AND CROSS-REFERENCE

This application is a Continuation application of U.S. patent application Ser. No. 17/373,016, filed on Jul. 12, 2021, which is a divisional application of U.S. patent application Ser. No. 16/180,511, filed on Nov. 5, 2018, which claims priority to U.S. Provisional Application No. 62/733,936, filed on Sep. 20, 2018, the entirety of which are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating layers or dielectric layers, conductive layers, and semiconductor layers over a semiconductor substrate, and patterning the various material layers using photolithography processes and etching processes to form circuit components and elements thereon.

Many integrated circuits are typically manufactured on a semiconductor wafer. The semiconductor wafer may be singulated into dies. The dies may be packaged, and various technologies have been developed for packaging.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
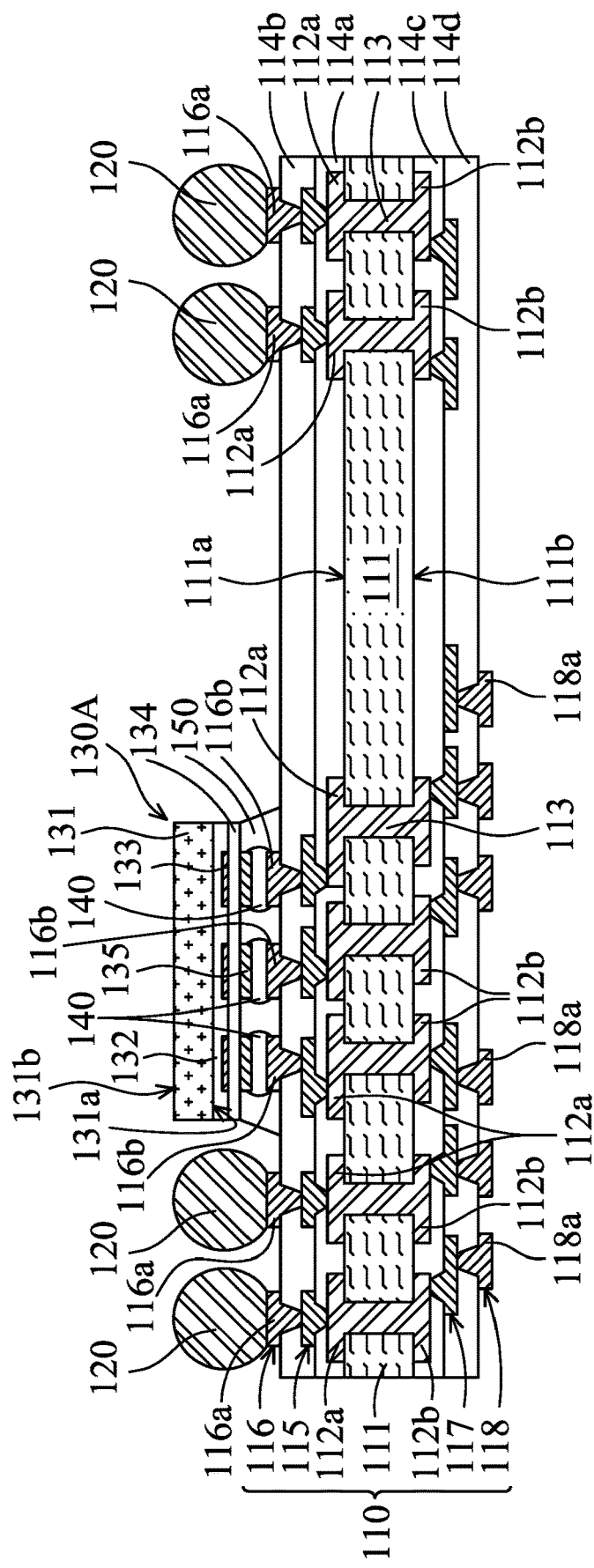
FIGS. 1A-1G are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution structure or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1G are cross-sectional views of various stages of a process for forming a chip package structure, in accordance with some embodiments. As shown in FIG. 1A, a substrate 110 is provided, in accordance with some embodiments. The substrate 110 includes a core layer 111, conductive pads 112a and 112b, conductive via structures 113, insulating layers 114a, 114b, 114c, and 114d, and wiring layers 115, 116, 117, and 118, in accordance with some embodiments.

The conductive via structures 113 pass through the core layer 111, in accordance with some embodiments. The core layer 111 has two opposite surfaces 111a and 111b, in accordance with some embodiments. The conductive pads 112a are over the surface 111a, in accordance with some embodiments. The conductive pads 112a are respectively over and connected to the conductive via structures 113 thereunder, in accordance with some embodiments. The conductive pads 112b are under the surface 111b, in accordance with some embodiments. The conductive pads 112b are respectively under and connected to the conductive via structures 113, in accordance with some embodiments.

The insulating layer 114a is over the surface 111a and covers the conductive pads 112a, in accordance with some embodiments. The wiring layer 115 is over the insulating layer 114a, in accordance with some embodiments. In some embodiments, portions of the wiring layer 115 pass through the insulating layer 114a and are connected to the conductive pads 112a.

The insulating layer 114b is over the insulating layer 114a and covers the wiring layer 115, in accordance with some embodiments. The wiring layer 116 is over the insulating layer 114b, in accordance with some embodiments. In some embodiments, portions of the wiring layer 116 pass through the insulating layer 114b and are connected to the wiring layer 115. The wiring layer 116 includes conductive pads 116a and 116b over the insulating layer 114b, in accordance with some embodiments.

The insulating layer 114c is over the surface 111b and covers the conductive pads 112b, in accordance with some embodiments. The wiring layer 117 is over the insulating layer 114c, in accordance with some embodiments. In some embodiments, portions of the wiring layer 117 pass through the insulating layer 114c and are connected to the conductive pads 112b.

The insulating layer 114d is over the insulating layer 114c and covers the wiring layer 117, in accordance with some embodiments. The wiring layer 118 is over the insulating layer 114d, in accordance with some embodiments. In some embodiments, portions of the wiring layer 118 pass through the insulating layer 114d and are connected to the wiring layer 117. The wiring layer 118 includes conductive pads 118a over the insulating layer 114d, in accordance with some embodiments.

The conductive pads 112a and 112b, the conductive via structures 113, and the wiring layers 115, 116, 117, and 118 include a conductive material, such as copper, aluminum, or tungsten, in accordance with some embodiments. The core layer 111 and the insulating layers 114a, 114b, 114c, and 114d include an insulating material, such as a polymer material, in accordance with some embodiments.

The polymer material includes an epoxy-containing material, such as prepreg (PP) or Ajinomoto build-up film (ABF). A prepreg (PP, "pre-impregnated") includes fibers, in accordance with some embodiments. A prepreg is a fiber reinforced polymer material, which is pre-impregnated with an epoxy resin material, in accordance with some embodiments. An Ajinomoto build-up film includes a non-fiber epoxy resin material, in accordance with some embodiments. The insulating layers 114a, 114b, 114c, and 114d are formed using a lamination process and an etching process, in accordance with some embodiments.

As shown in FIG. 1A, conductive bumps 120 are formed over the conductive pads 116a, in accordance with some embodiments. The conductive bumps 120 are respectively and electrically connected to the conductive pads 116a thereunder, in accordance with some embodiments. The conductive bumps 120 are made of a solder material, such as Sn and Ag or another suitable conductive material (e.g., gold), in accordance with some embodiments. The conductive bumps 120 are solder balls, in accordance with some embodiments.

As shown in FIG. 1A, a chip 130A is bonded to the conductive pads 116b of the substrate 110 through conductive bumps 140, in accordance with some embodiments. The chip 130A is also referred to as a system-on-chip (SoC), a logic chip, a memory chip, or radio frequency front end (RFFE) modules such as radio frequency chips, baseband (BB) chips, power amplifier, or the like, in accordance with some embodiments. The conductive bumps 120 surround the chip 130A, in accordance with some embodiments.

The chip 130A includes a semiconductor substrate 131, a dielectric layer 132, conductive pads 133, and an interconnection layer 134, in accordance with some embodiments. The chip 130A further includes conductive structures 135, in accordance with some embodiments.

The semiconductor substrate 131 has a front surface 131a and a back surface 131b opposite to the front surface 131a, in accordance with some embodiments. In some embodiments, active elements (e.g. transistors, diodes, or the like) and/or passive elements (e.g. resistors, capacitors, inductors, or the like) are formed under the front surface 131a or in the semiconductor substrate 131 adjacent to the front surface 131a.

In some embodiments, the semiconductor substrate 131 is made of at least an elementary semiconductor material including silicon or germanium in a single crystal, polycrystal, or amorphous structure. In some other embodiments, the semiconductor substrate 131 is made of a compound semiconductor, such as silicon carbide, gallium arsenide, gallium phosphide, indium phosphide, indium arsenide, an alloy semiconductor, such as SiGe, or GaAsP, or a combination thereof. The semiconductor substrate 131 may also include multi-layer semiconductors, semiconductor on insulator (SOI) (such as silicon on insulator or germanium on insulator), or a combination thereof.

The dielectric layer 132 is formed under the semiconductor substrate 131, in accordance with some embodiments. The dielectric layer 132 is made of a polymer material, such as a polybenzoxazole (PBO) layer, a polyimide layer, a benzocyclobutene (BCB) layer, an epoxy layer, a photosensitive material layer, or another suitable material.

The conductive pads 133 are formed in the dielectric layer 132, in accordance with some embodiments. The conductive pads 133 are electrically connected to devices (not shown) formed in/over the semiconductor substrate 131, in accordance with some embodiments. The conductive pads 133 are made of a conductive material, such as copper (Cu), copper alloy, aluminum (Al), aluminum alloy, tungsten (W), tungsten alloy, titanium (Ti), titanium alloy, tantalum (Ta) or tantalum alloy, in accordance with some embodiments.

The interconnection layer 134 is formed under the dielectric layer 132, in accordance with some embodiments. The interconnection layer 134 includes dielectric layers (not shown) and conductive interconnection structures (not shown) in the dielectric layers, in accordance with some embodiments. The conductive structures 135 are formed under the interconnection layer 134, in accordance with some embodiments. The conductive structures 135 include conductive pillars or conductive bumps (e.g., micro-bumps), in accordance with some embodiments.

The interconnection structures are electrically connected to the conductive structures 135 and the conductive pads 133, in accordance with some embodiments. The conductive structures 135 are made of a conductive material, such as copper (Cu), copper alloy, aluminum (Al), aluminum alloy, tungsten (W), tungsten alloy, titanium (Ti), titanium alloy, tantalum (Ta) or tantalum alloy, in accordance with some embodiments.

The conductive structures 135 are respectively bonded to the conductive pads 116b thereunder through conductive layers 140 therebetween, in accordance with some embodiments. The conductive layers 140 are made of a solder material, such as Sn and Ag or another suitable conductive material, in accordance with some embodiments. As shown in FIG. 1A, an underfill layer 150 is formed between the chip 130A and the substrate 110, in accordance with some embodiments. The underfill layer 150 includes an insulating material, such as a polymer material, in accordance with some embodiments.

Figure 1B:
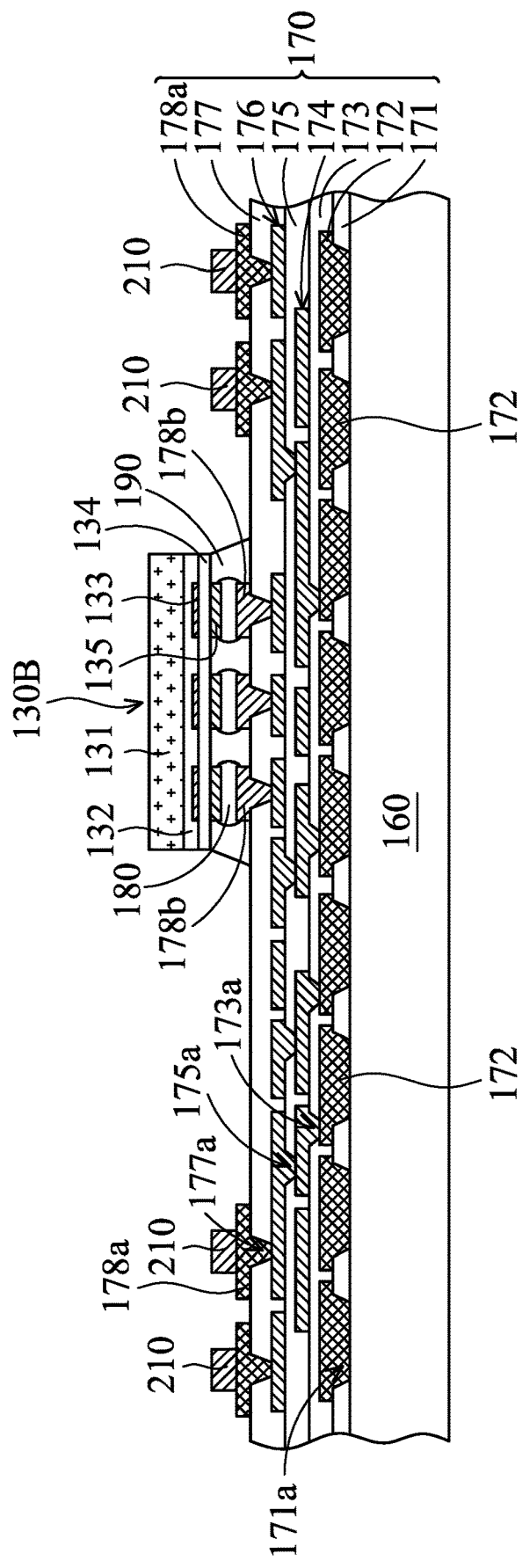

As shown in FIG. 1B, a carrier substrate 160 is provided, in accordance with some embodiments. The carrier substrate 160 is configured to provide temporary mechanical and structural support during subsequent processing steps, in accordance with some embodiments. The carrier substrate 160 includes glass, silicon oxide, aluminum oxide, metal, a combination thereof, and/or the like, in accordance with some embodiments. The carrier substrate 160 includes a metal frame, in accordance with some embodiments.

As shown in FIG. 1B, a redistribution structure 170 is formed over the carrier substrate 160, in accordance with some embodiments. The formation of the redistribution structure 170 includes forming an insulating layer 171 over the carrier substrate 160; forming conductive pads 172 over the insulating layer 171 and in through holes 171a of the insulating layer 171; forming an insulating layer 173 over the insulating layer 171 and the conductive pads 172; forming a wiring layer 174 over the insulating layer 173 and in through holes 173a of the insulating layer 173; forming an insulating layer 175 over the insulating layer 173 and the wiring layer 174; forming a wiring layer 176 over the insulating layer 175 and in through holes 175a of the insulating layer 175; forming an insulating layer 177 over the insulating layer 175 and the wiring layer 176; and forming conductive pads 178a and 178b over the insulating layer 177 and in through holes 177a of the insulating layer 177. The conductive pad 178a is wider than the conductive pad 178b, in accordance with some embodiments. The conductive pads 178a surround the conductive pads 178b, in accordance with some embodiments.

In some embodiments, the conductive pads 172 are in direct contact with the carrier substrate 160. In some other embodiments (not shown), the conductive pads 172 are spaced apart from the carrier substrate 160. The wiring layers 174 and 176 are electrically connected to each other, in accordance with some embodiments. The conductive pads 172, 178a, and 178b are electrically connected to the wiring layers 174 and 176, in accordance with some embodiments.

The insulating layers 171, 173, 175, and 177 are made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The wiring layers 174 and 176 and the conductive pads 172, 178a and 178b are made of a conductive material, such as metal (e.g. copper, aluminum, or tungsten), in accordance with some embodiments.

As shown in FIG. 1B, a chip 130B is bonded to the conductive pads 178b of the redistribution structure 170, in accordance with some embodiments. The chip 130B is similar to or the same as the chip 130A of FIG. 1A, in accordance with some embodiments. The chip 130B includes a semiconductor substrate 131, a dielectric layer 132, conductive pads 133, an interconnection layer 134, and conductive structures 135, which are respectively similar to or the same as the semiconductor substrate 131, the dielectric layer 132, the conductive pads 133, the interconnection layer 134, and the conductive structures 135 of the chip 130A of FIG. 1A, in accordance with some embodiments. Therefore, the detailed description of the chip 130B is not repeated herein.

The conductive structures 135 are respectively bonded to the conductive pads 178b thereunder through conductive layers 180 therebetween, in accordance with some embodiments. The conductive layers 180 are made of a solder material, such as Sn and Ag or another suitable conductive material, in accordance with some embodiments.

As shown in FIG. 1B, an underfill layer 190 is formed between the chip 130B and the redistribution structure 170, in accordance with some embodiments. The underfill layer 190 includes an insulating material, such as a polymer material, in accordance with some embodiments.

As shown in FIG. 1B, pillar structures 210 are formed over the conductive pads 178a of the redistribution structure 170, in accordance with some embodiments. The pillar structures 210 are made of a conductive material, such as metal (e.g. copper, aluminum, or tungsten), in accordance with some embodiments.

Figure 1C:
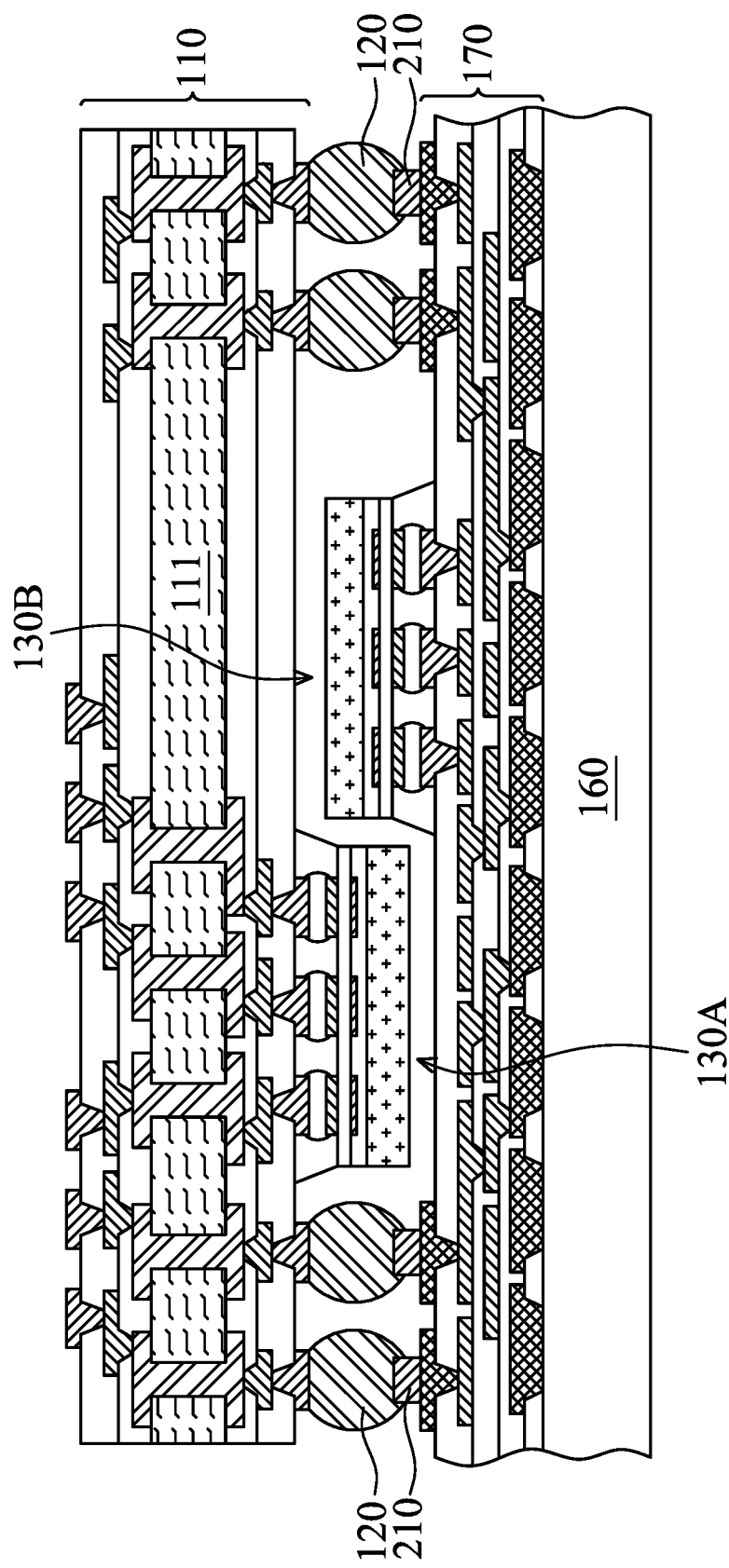

As shown in FIG. 1C, the substrate 110 is bonded to the redistribution structure 170 through the conductive bumps 120, in accordance with some embodiments. The chips 130A and 130B are between the substrate 110 and the redistribution structure 170, in accordance with some embodiments. The conductive bumps 120 surround the chips 130A and 130B, in accordance with some embodiments.

The bonding process includes disposing the conductive bumps 120 over the pillar structures 210; and performing a reflowing process to connect the conductive bumps 120 to the pillar structures 210, in accordance with some embodiments. The pillar structures 210 penetrate into the conductive bumps 120 during the reflowing process, in accordance with some embodiments.

Figure 1D:
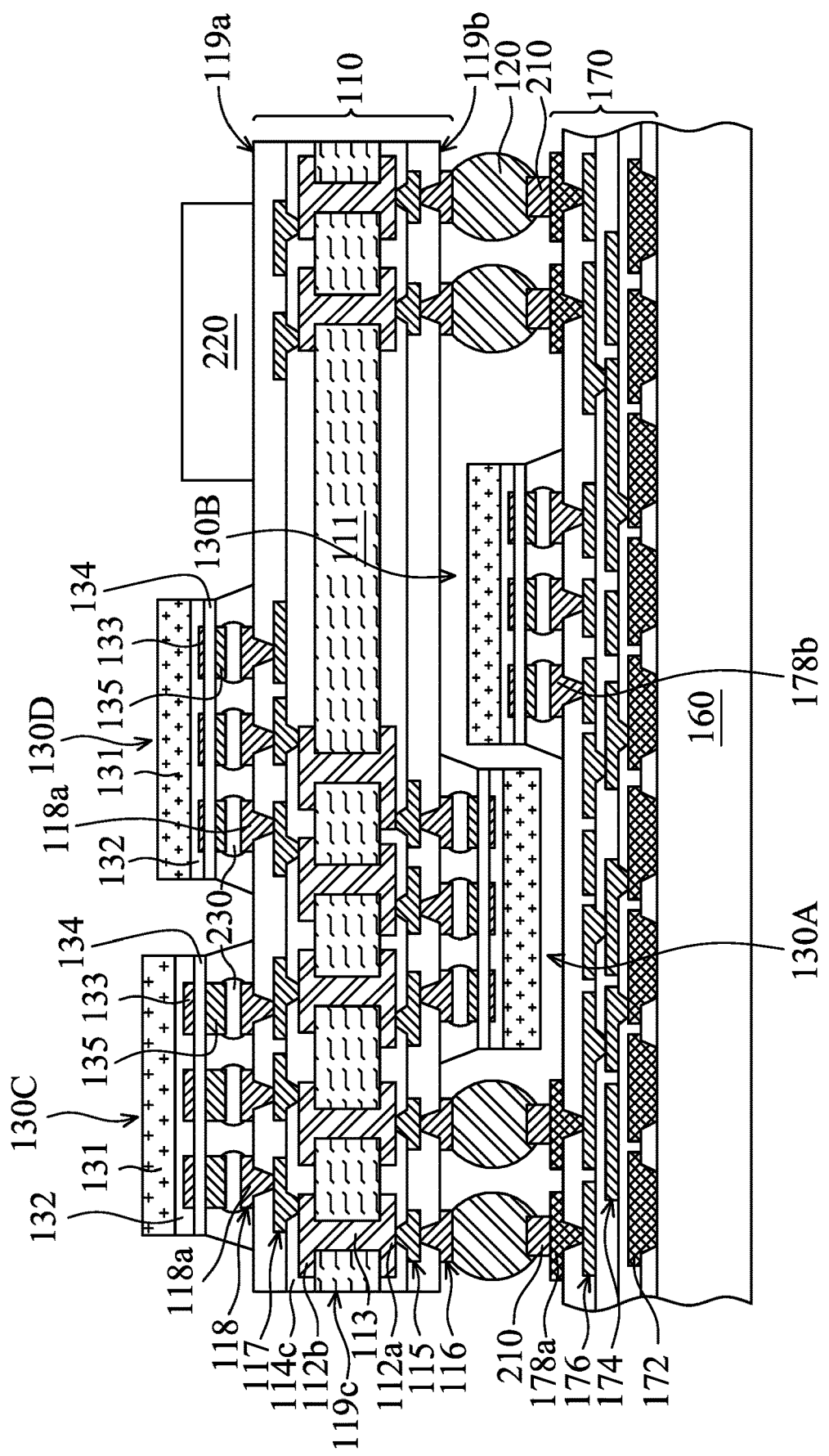

As shown in FIG. 1D, the substrate 110 has two opposite surface 119a and 119b, in accordance with some embodiments. The surface 119a faces away from the redistribution structure 170, in accordance with some embodiments. The substrate 110 has sidewalls 119c between the surface 119a and 119b, in accordance with some embodiments. As shown in FIG. 1D, chips 130C and 130D and a passive device 220 are bonded to the surface 119a, in accordance with some embodiments. In some other embodiments, a passive device (not shown) is bonded to the surface 119b. The chips 130C and 130D are similar to or the same as the chip 130A of FIG. 1A, in accordance with some embodiments.

Each of the chips 130C and 130D includes a semiconductor substrate 131, a dielectric layer 132, conductive pads 133, an interconnection layer 134, and conductive structures 135, which are respectively similar to or the same as the semiconductor substrate 131, the dielectric layer 132, the conductive pads 133, the interconnection layer 134, and the conductive structures 135 of the chip 130A of FIG. 1A, in accordance with some embodiments. Therefore, the detailed description of the chips 130C and 130D are not repeated herein.

The conductive structures 135 are respectively bonded to the conductive pads 118a thereunder through conductive layers 230 therebetween, in accordance with some embodiments. The chips 130C and 130D are electrically connected to the redistribution structure 170 through the conductive layers 230, the wiring layers 117 and 118, the conductive pads 112a and 112b, the conductive via structures 113, the wiring layers 115 and 116, the conductive bumps 120, and the pillar structures 210, in accordance with some embodiments.

The conductive layers 230 are made of a solder material, such as Sn and Ag or another suitable conductive material, in accordance with some embodiments. The passive device 220 is electrically connected to the wiring layers 117 and 118, in accordance with some embodiments. The passive device 220 includes a resistor, an inductor, a capacitor, or another suitable passive device, in accordance with some embodiments.

Figure 1E:
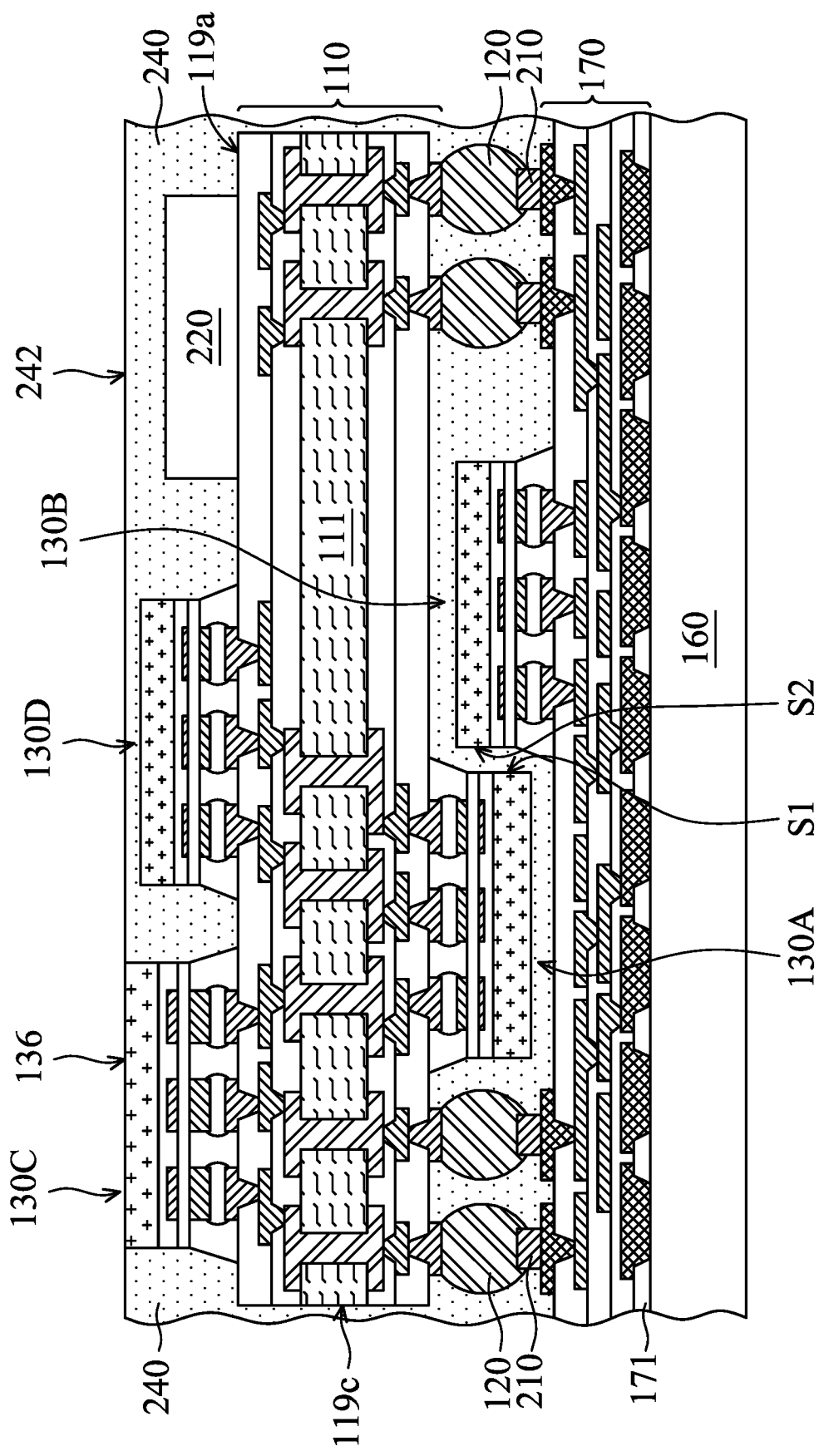

As shown in FIG. 1E, a molding layer 240 is formed between the substrate 110 and the redistribution structure 170 and is formed over the sidewalls 119c and the surface 119a of the substrate 110, in accordance with some embodiments. The molding layer 240 encapsulates the chips 130A and 130B, in accordance with some embodiments. The molding layer 240 surrounds the chips 130A and 130B, the conductive bumps 120, and the pillar structures 210, in accordance with some embodiments.

The molding layer 240 encapsulates the chips 130C and 130D and the passive device 220, in accordance with some embodiments. The molding layer 240 surrounds the chips 130C and 130D and the passive device 220, in accordance with some embodiments.

In some embodiments, a top surface 242 of the molding layer 240 is substantially coplanar with a top surface 136 of the chip 130C. The top surface 136 of the chip 130C is exposed to the external atmosphere, which improves heat dissipation rate, in accordance with some embodiments. In some embodiments, a portion of the molding layer 240 is between a sidewall S1 of the chip 130A and a sidewall S2 of the chip 130B.

The molding layer 240 is made of an insulating material, such as a polymer material, in accordance with some embodiments. The molding layers 240 are formed in the same molding process (e.g., a transfer molding process) and therefore are made of the same material, in accordance with some embodiments. The materials of the molding layers 240 are different from the materials of the core layer 111 and the insulating layers 114a, 114b, 114c, and 114d, in accordance with some embodiments.

Figure 1F:
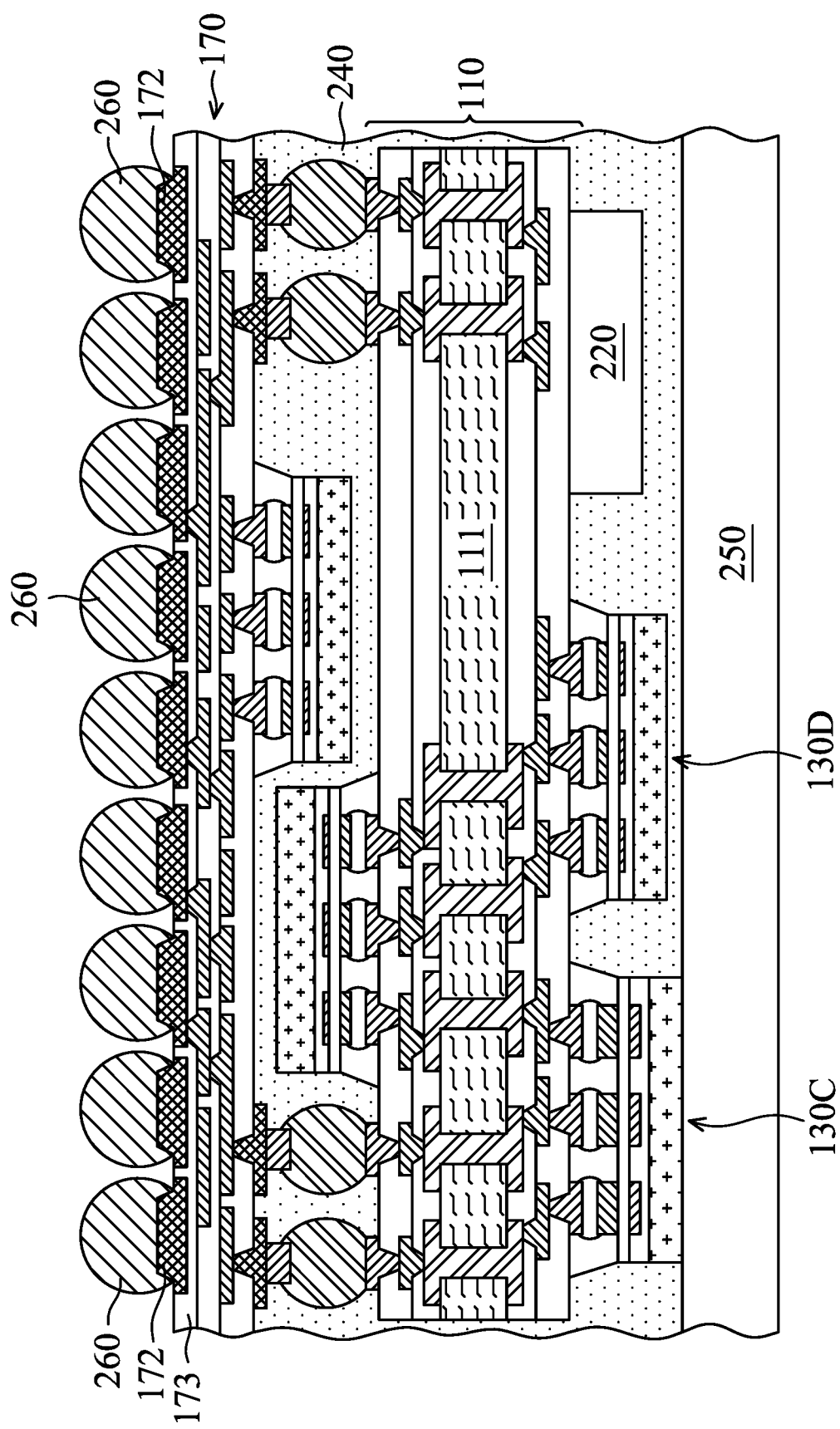

As shown in FIG. 1F, a carrier substrate 250 is bonded to the molding layer 240, in accordance with some embodiments. The carrier substrate 250 is configured to provide temporary mechanical and structural support during subsequent processing steps, in accordance with some embodiments. The carrier substrate 250 includes glass, silicon, silicon oxide, aluminum oxide, metal, a combination thereof, and/or the like, in accordance with some embodiments. The carrier substrate 250 includes a metal frame, in accordance with some embodiments.

As shown in FIG. 1F, the carrier substrate 160 is removed, in accordance with some embodiments. As shown in FIG. 1F, the substrate 110 is flipped upside down, in accordance with some embodiments. As shown in FIG. 1F, the insulating layer 171 of the redistribution structure 170 is removed, in accordance with some embodiments. In some other embodiments (not shown), the insulating layer 171 is partially removed to expose more surfaces of the conductive pads 172. The insulating layer 171 is (partially) removed by a dry etching process or a wet etch process, in accordance with some embodiments.

As shown in FIG. 1F, conductive bumps 260 are respectively formed over the conductive pads 172, in accordance with some embodiments. The conductive bumps 260 are made of a conductive material, such as a solder material (e.g., Sn, Ag, or Au), in accordance with some embodiments.

Figure 1G:
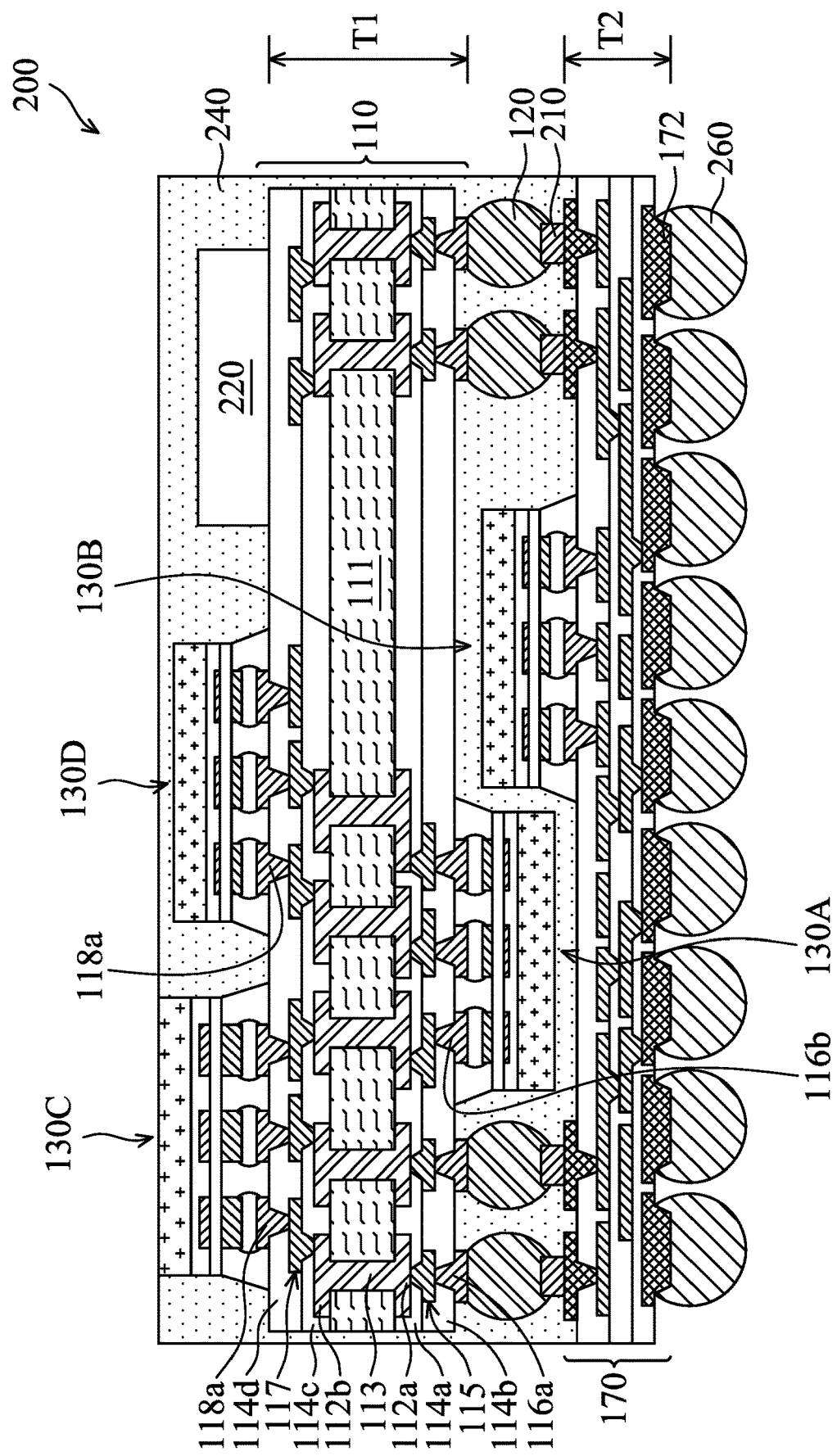

As shown in FIG. 1G, a cutting process is performed over the redistribution structure 170 to cut through the redistribution structure 170 and the molding layer 240 to form chip package structures 200, in accordance with some embodiments. For the sake of simplicity, FIG. 1G only shows one of the chip package structures 200, in accordance with some embodiments.

In the chip package structures 200, the substrate 110 has a thickness T1, and the redistribution structure 170 has a thickness T2, in accordance with some embodiments. The thickness T1 is greater than the thickness T2, in accordance with some embodiments. In some embodiments, a ratio of the thickness T1 to the thickness T2 ranges from about 7 to about 13.

In the chip package structures 200, the conductive pads 118a are electrically connected to the conductive pads 116b through the wiring layer 117, the conductive pads 112b, the conductive via structures 113, the conductive pads 112a, and the wiring layer 115, in accordance with some embodiments. Therefore, the chips 130C and 130D are able to be electrically connected to the chip 130A through the substrate 110, in accordance with some embodiments.

The chip 130C (or the chip 130D) is able to be situated face-to-face with the chip 130A, and therefore the electrical connection path between the chip 130C (or the chip 130D) and the chip 130A is short, in accordance with some embodiments. As a result, the operation speed of the chip package structure 200 is improved, which improves the performance of the chip package structure 200. Furthermore, the power consumption of the chip package structure 200 is lowered, in accordance with some embodiments.

Since both two opposite sides of the substrate 110 are able to be bonded with chips, the integration density of the chips 130A, 130C, and 130D is improved, which reduces the size of the chip package structure 200, in accordance with some embodiments. The active devices (e.g., the chips 130A, 130B, 130C, and 130D) and the passive device 220 are able to be integrated on the substrate 110 and the redistribution structure 170 in the chip package structure 200, in accordance with some embodiments.

Since the materials of the substrate 110 (or the core layer 111 and the insulating layers 114a, 114b, 114c, and 114d) are different from the materials of the molding layers 240, the warpage of the chip package structure 200 may be reduced by adjusting thicknesses of the substrate 110 and the molding layers 240. The suitable thickness ratio of the substrate 110 to the molding layers 240 may be calculated by computer simulation. Since the warpage of the chip package structure 200 is reduced, the reliability of the joints (e.g., the conductive bumps 120) of the chip package structure 200 is improved, in accordance with some embodiments.

Figure 2:
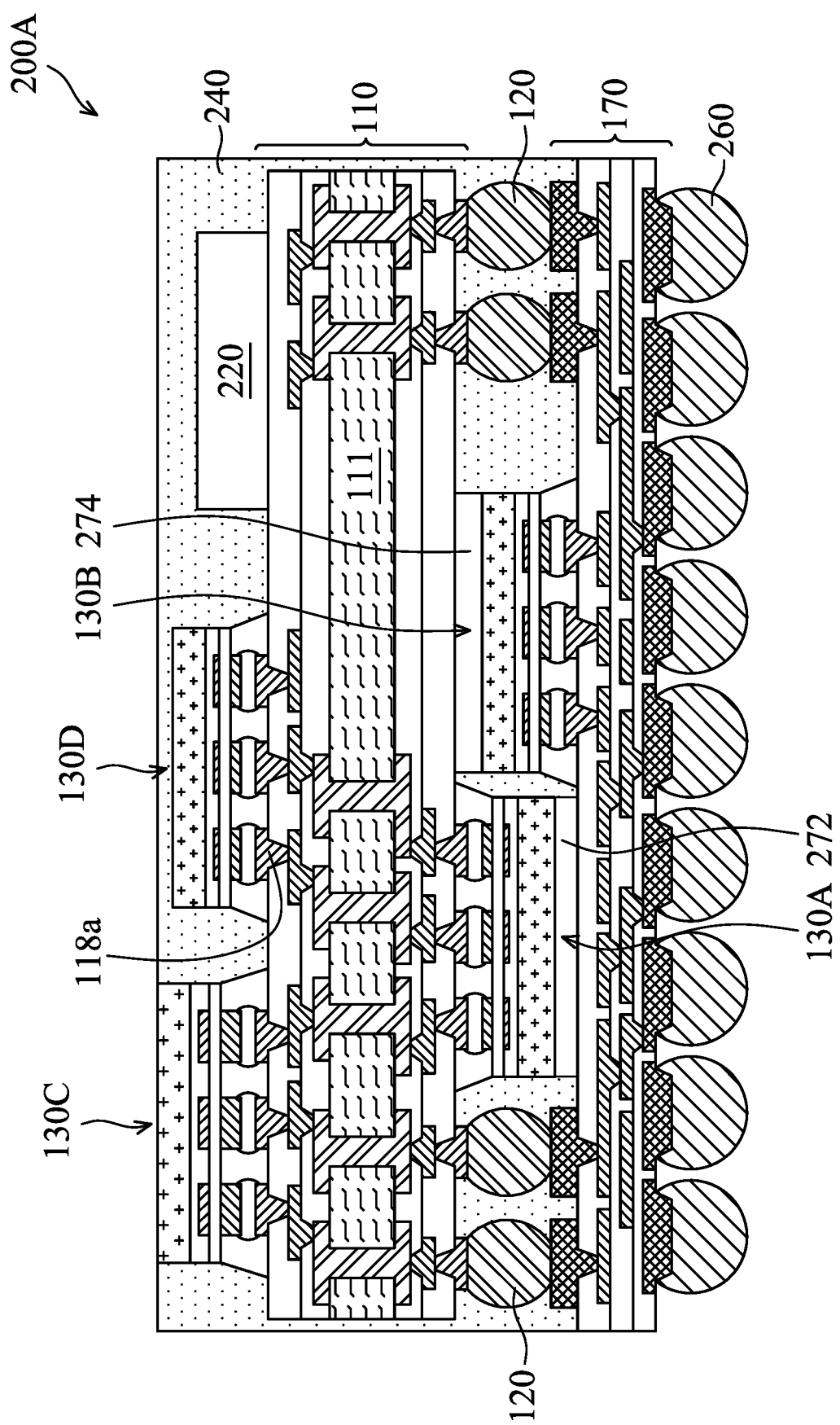
FIG. 2 is a cross-sectional view of a chip package structure, in accordance with some embodiments.

FIG. 2 is a cross-sectional view of a chip package structure 200A, in accordance with some embodiments. As shown in FIG. 2, the chip package structure 200A is similar to the chip package structure 200 of FIG. 1G, except that the chip package structure 200A further includes adhesive layers 272 and 274, in accordance with some embodiments.

The adhesive layer 272 is between the chip 130A and the redistribution structure 170, in accordance with some embodiments. The adhesive layer 274 is between the chip 130B and the substrate 110, in accordance with some embodiments. The adhesive layers 272 and 274 are made of a polymer material, a heat dissipation material (e.g., a silver paste, a copper paste, or a tin paste), or another suitable material, in accordance with some embodiments. In some embodiments, the adhesive layers 272 and 274 are made of the same material. In some other embodiments, the adhesive layers 272 and 274 are made of different materials.

In some embodiments, the adhesive layer 272 is formed over the chip 130A before bonding the substrate 110 to the redistribution structure 170. In some other embodiments, the adhesive layer 272 is formed over the redistribution structure 170 before bonding the substrate 110 to the redistribution structure 170.

In some embodiments, the adhesive layer 274 is formed over the chip 130B before bonding the substrate 110 to the redistribution structure 170. In some other embodiments, the adhesive layer 274 is formed over the substrate 110 before bonding the substrate 110 to the redistribution structure 170.

Figure 3A:
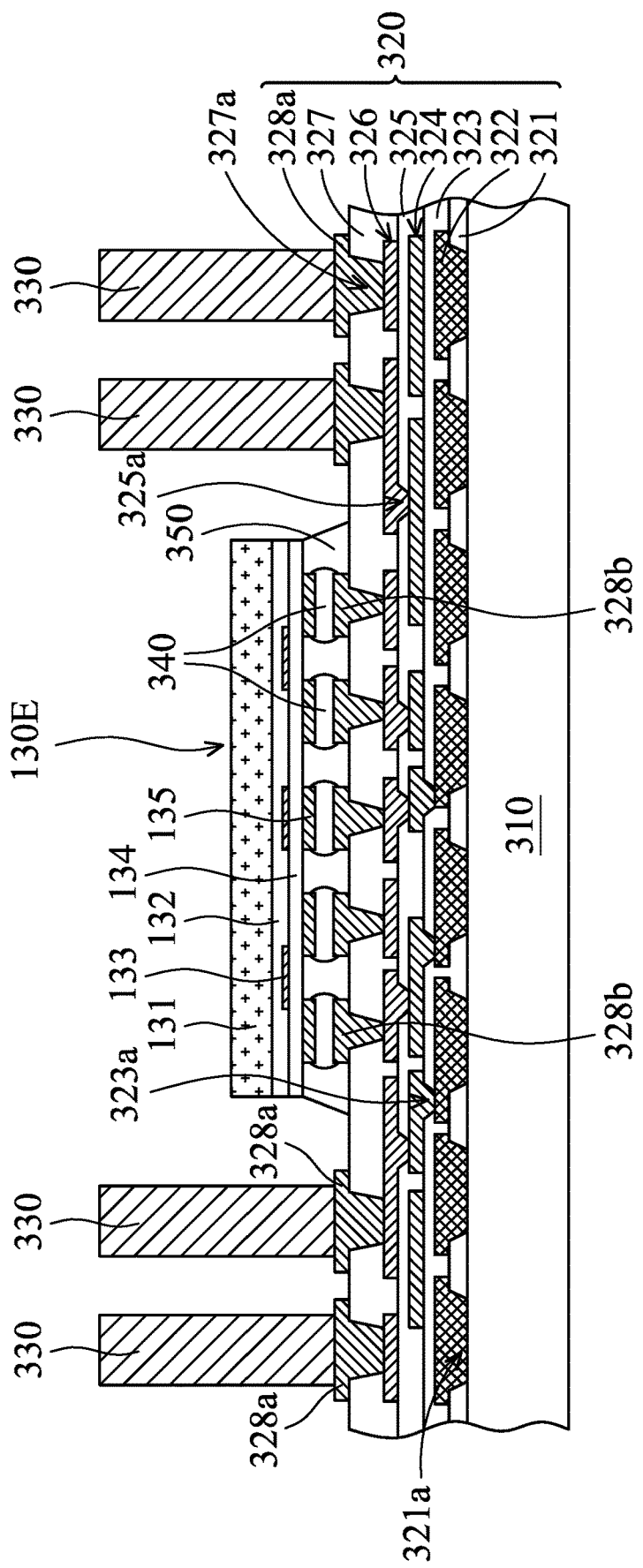
FIGS. 3A-3H are cross-sectional views of various stages of a process for forming a chip package structure, in accordance with some embodiments.

FIGS. 3A-3H are cross-sectional views of various stages of a process for forming a chip package structure, in accordance with some embodiments. As shown in FIG. 3A, a carrier substrate 310 is provided, in accordance with some embodiments. The carrier substrate 310 is configured to provide temporary mechanical and structural support during subsequent processing steps, in accordance with some embodiments.

The carrier substrate 310 includes glass, silicon, silicon oxide, aluminum oxide, metal, a combination thereof, and/or the like, in accordance with some embodiments. The carrier substrate 310 includes a metal frame, in accordance with some embodiments. In some embodiments (not shown), an adhesion layer is coated onto the carrier substrate 310 for the following debonding process.

As shown in FIG. 3A, a redistribution structure 320 is formed over the carrier substrate 310, in accordance with some embodiments. The formation of the redistribution structure 320 includes forming an insulating layer 321 over the carrier substrate 310; forming conductive pads 322 over the insulating layer 321 and in through holes 321a of the insulating layer 321; forming an insulating layer 323 over the insulating layer 321 and the conductive pads 322; forming a wiring layer 324 over the insulating layer 323 and in through holes 323a of the insulating layer 323; forming an insulating layer 325 over the insulating layer 323 and the wiring layer 324; forming a wiring layer 326 over the insulating layer 325 and in through holes 325a of the insulating layer 325; forming an insulating layer 327 over the insulating layer 325 and the wiring layer 326; and forming conductive pads 328a and 328b over the insulating layer 327 and in through holes 327a of the insulating layer 327.

The conductive pad 328a is wider than the conductive pad 328b, in accordance with some embodiments. The conductive pads 328a surround the conductive pads 328b, in accordance with some embodiments. In some embodiments, the conductive pads 322 are in direct contact with the carrier substrate 310. In some other embodiments (not shown), the conductive pads 322 are spaced apart from the carrier substrate 310.

The wiring layers 324 and 326 are electrically connected to each other, in accordance with some embodiments. The conductive pads 322, 328a, and 328b are electrically connected to the wiring layers 324 and 326, in accordance with some embodiments.

The insulating layers 321, 323, 325, and 327 are made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The wiring layers 324 and 326 and the conductive pads 322, 328a and 328b are made of a conductive material, such as metal (e.g. copper, aluminum, or tungsten), in accordance with some embodiments.

As shown in FIG. 3A, conductive pillars 330 are formed over the conductive pads 328a of the redistribution structure 320, in accordance with some embodiments. The pillar structures 330 are made of a conductive material, such as metal (e.g. copper, aluminum, or tungsten), in accordance with some embodiments.

Thereafter, as shown in FIG. 3A, a chip 130E is bonded to the conductive pads 328b of the redistribution structure 320, in accordance with some embodiments. The pillar structures 330 surround the chip 130E, in accordance with some embodiments. In some embodiments (not shown), a top surface of the chip 130E is substantially coplanar with a top surface of the pillar structure 330. The chip 130E is similar to or the same as the chip 130A of FIG. 1A, in accordance with some embodiments.

The chip 130E includes a semiconductor substrate 131, a dielectric layer 132, conductive pads 133, an interconnection layer 134, and conductive structures 135, which are respectively similar to or the same as the semiconductor substrate 131, the dielectric layer 132, the conductive pads 133, the interconnection layer 134, and the conductive structures 135 of the chip 130A of FIG. 1A, in accordance with some embodiments. Therefore, the detailed description of the chip 130E is not repeated herein.

The conductive structures 135 are respectively bonded to the conductive pads 328b thereunder through conductive layers 340 therebetween, in accordance with some embodiments. The conductive layers 340 are made of a solder material, such as Sn and Ag or another suitable conductive material, in accordance with some embodiments. As shown in FIG. 3A, an underfill layer 350 is formed between the chip 130E and the redistribution structure 320, in accordance with some embodiments. The underfill layer 350 includes an insulating material, such as a polymer material, in accordance with some embodiments.

Figure 3B:
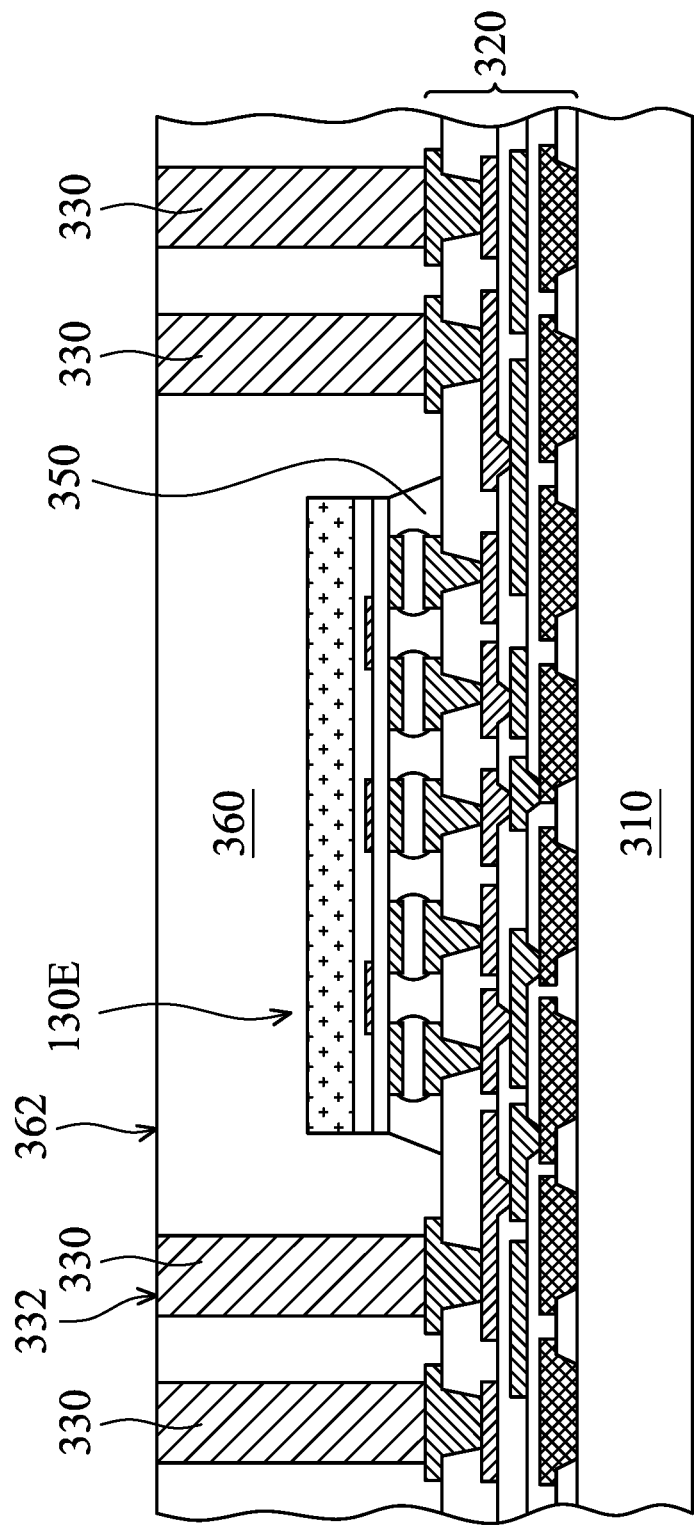

As shown in FIG. 3B, a molding layer 360 is formed over the redistribution structure 320, in accordance with some embodiments. The molding layer 360 surrounds the conductive pillars 330 and the chip 130E, in accordance with some embodiments. The molding layer 360 covers the chip 130E, in accordance with some embodiments. The conductive pillars 330 pass through the molding layer 360, in accordance with some embodiments.

As shown in FIG. 3B, top surfaces 332 of the conductive pillars 330 and a top surface 362 of the molding layer 360 are substantially coplanar, in accordance with some embodiments. The molding layer 360 is made of a polymer material, such as Ajinomoto build-up film (ABF). An Ajinomoto build-up film includes a non-fiber epoxy resin material, in accordance with some embodiments. The molding layer 360 is formed using a molding process such as a transfer molding process, in accordance with some embodiments.

Figure 3C:
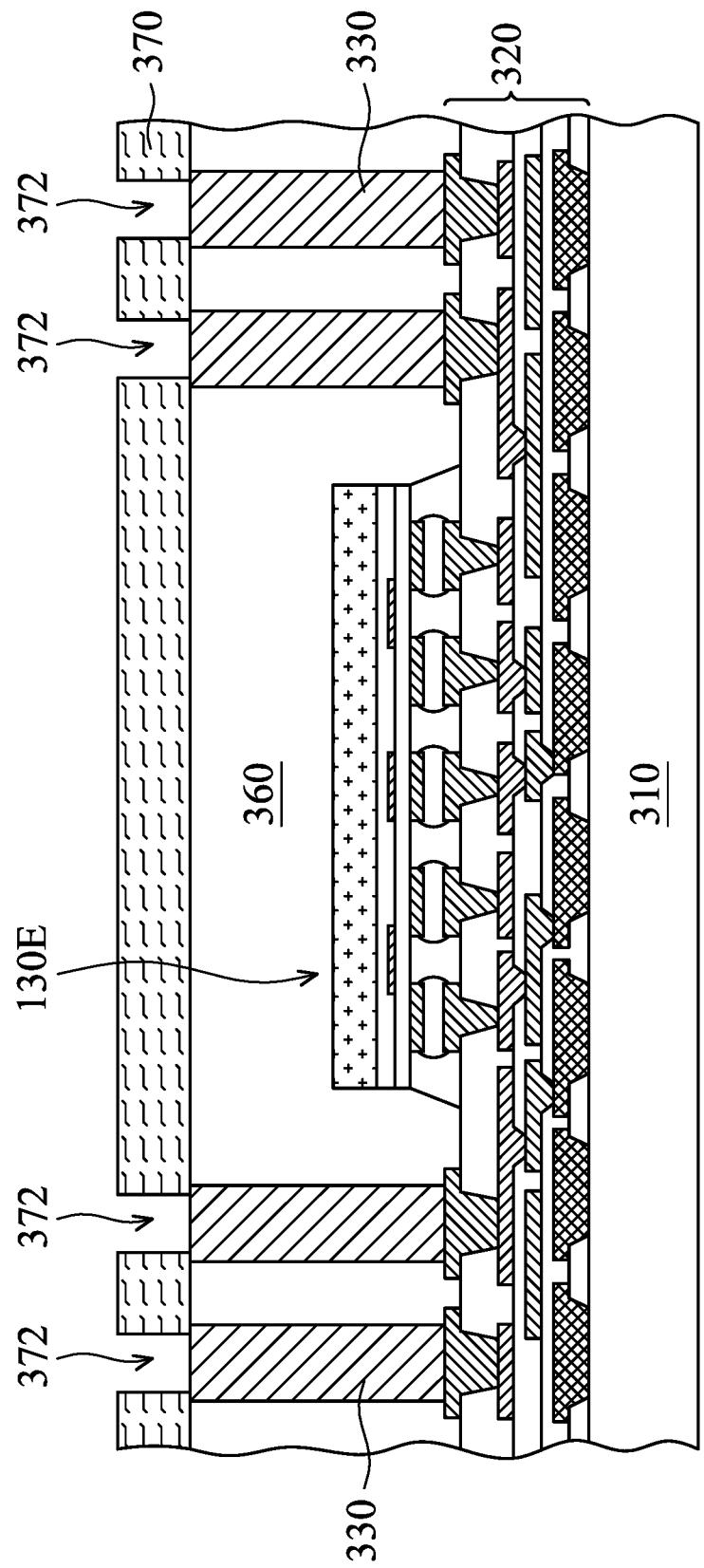

As shown in FIG. 3C, a cap layer 370 is formed over the molding layer 360 and the conductive pillars 330, in accordance with some embodiments. The cap layer 370 is in direct contact with the molding layer 360, in accordance with some embodiments. The cap layer 370 includes fibers, in accordance with some embodiments. The cap layer 370 is made of a polymer material with fibers, such as prepreg, in accordance with some embodiments. The cap layer 370 and the molding layer 360 are made of different materials, in accordance with some embodiments. The cap layer 370 is formed using a lamination process, in accordance with some embodiments.

Thereafter, as shown in FIG. 3C, through holes 372 are formed in the cap layer 370, in accordance with some embodiments. The through holes 372 respectively expose the conductive pillars 330 thereunder, in accordance with some embodiments. The through holes 372 are formed using a laser drilling process, a wet etching process, or a dry etching process, in accordance with some embodiments.

Figure 3D:
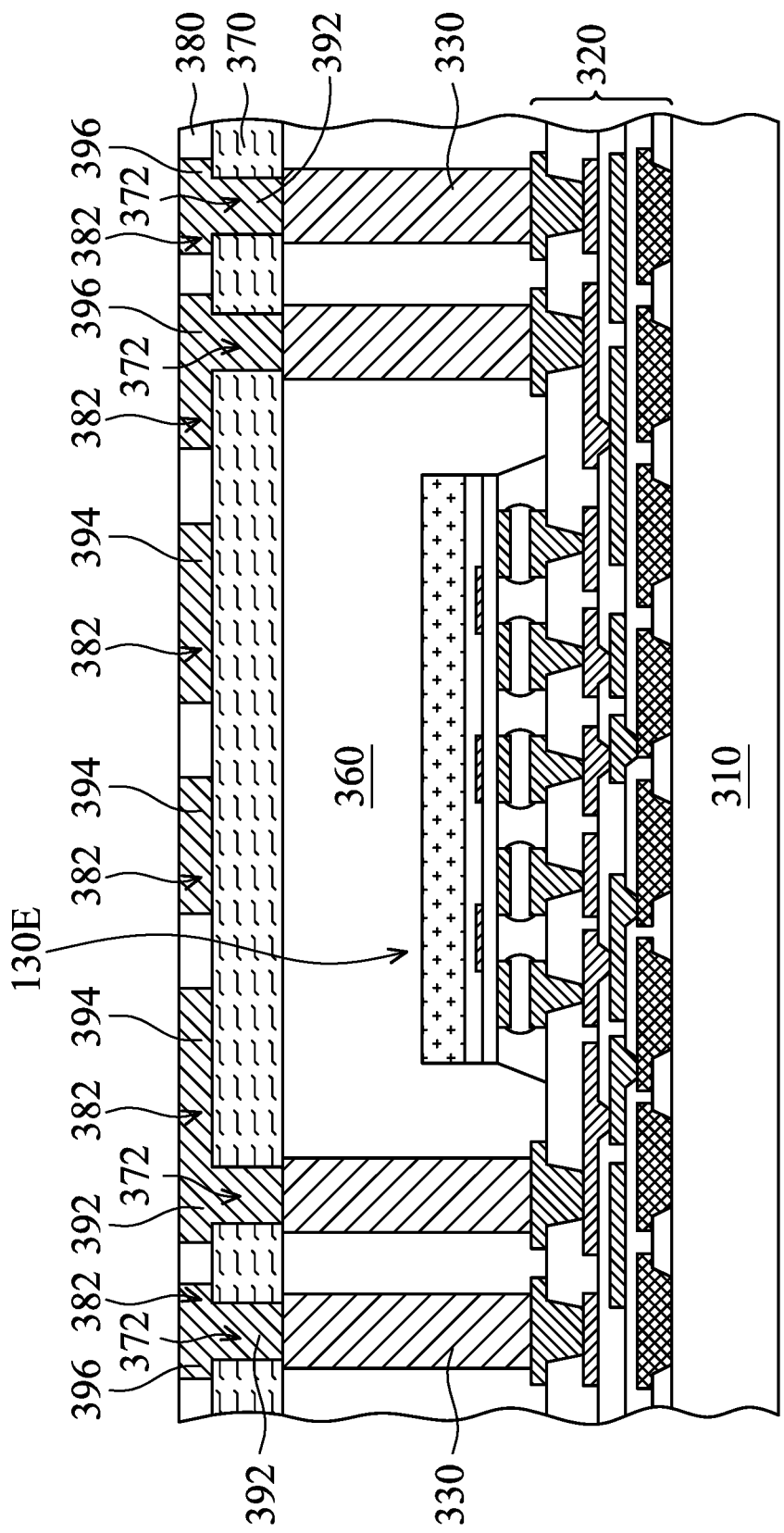

As shown in FIG. 3D, a mask layer 380 is formed over the cap layer 370, in accordance with some embodiments. The mask layer 380 is made of a polymer material, such as a photoresist material, in accordance with some embodiments. The mask layer 380 is formed using a coating process, in accordance with some embodiments.

As shown in FIG. 3D, openings 382 are formed in the mask layer 380, in accordance with some embodiments. The openings 382 expose portions of the cap layer 370, in accordance with some embodiments. Some of the openings 382 are respectively over and connected to the through holes 372, in accordance with some embodiments. The openings 382 are formed using a photolithography process, in accordance with some embodiments.

As shown in FIG. 3D, conductive via structures 392, conductive lines 394, and conductive pads 396 are formed, in accordance with some embodiments. The conductive via structures 392 are respectively formed in the through holes 372, in accordance with some embodiments. The conductive lines 394 are formed over the cap layer 370, in accordance with some embodiments.

The conductive pads 396 are partially over and electrically connected to the conductive via structures 392 thereunder, in accordance with some embodiments. The conductive via structures 392 are respectively connected to the conductive pillars 330 thereunder, in accordance with some embodiments. The conductive via structures 392 are respectively in direct contact with the conductive pillars 330 thereunder, in accordance with some embodiments.

Figure 3E:
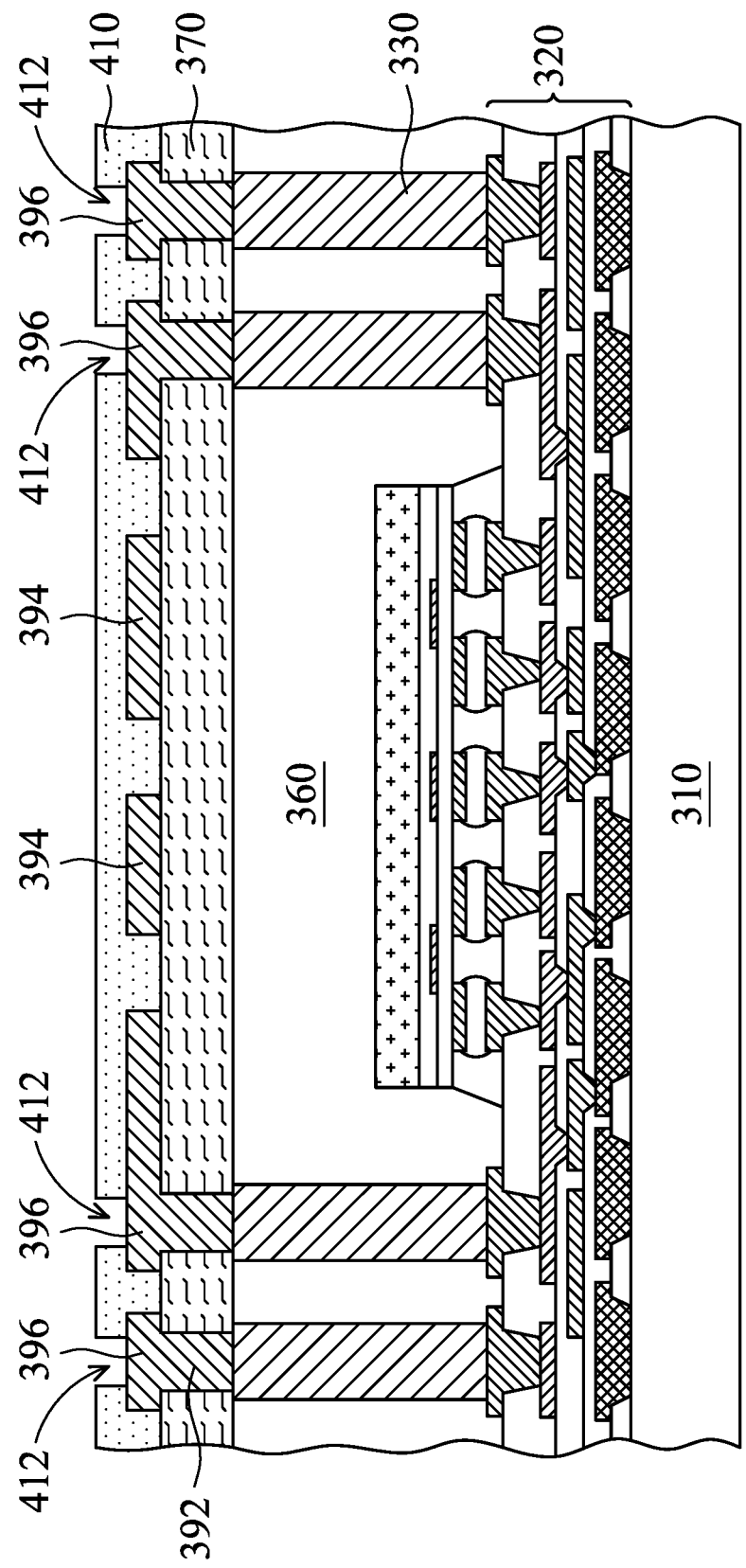

As shown in FIG. 3E, the mask layer 380 is removed, in accordance with some embodiments. As shown in FIG. 3E, a solder resist layer 410 is formed over the cap layer 370, the conductive pads 396, and the conductive lines 394, in accordance with some embodiments. As shown in FIG. 3E, openings 412 are formed in the solder resist layer 410, in accordance with some embodiments.

The openings 412 respectively expose the conductive pads 396, in accordance with some embodiments. The solder resist layer 410 is made of a polymer material, such as a photoresist material, in accordance with some embodiments. The solder resist layer 410 is formed using a coating process, in accordance with some embodiments. In some embodiments, the solder resist layer 410 is made of a photoresist material, and the openings 412 are formed using a photolithography process. In some embodiments (not shown), a surface finish layer is formed over the conductive pads 396. The surface finish layer includes, for example, electroless nickel immersion gold (ENIG), electroless nickel electroless palladium immersion gold (ENEPIG), and/or solder paste.

Figure 3F:
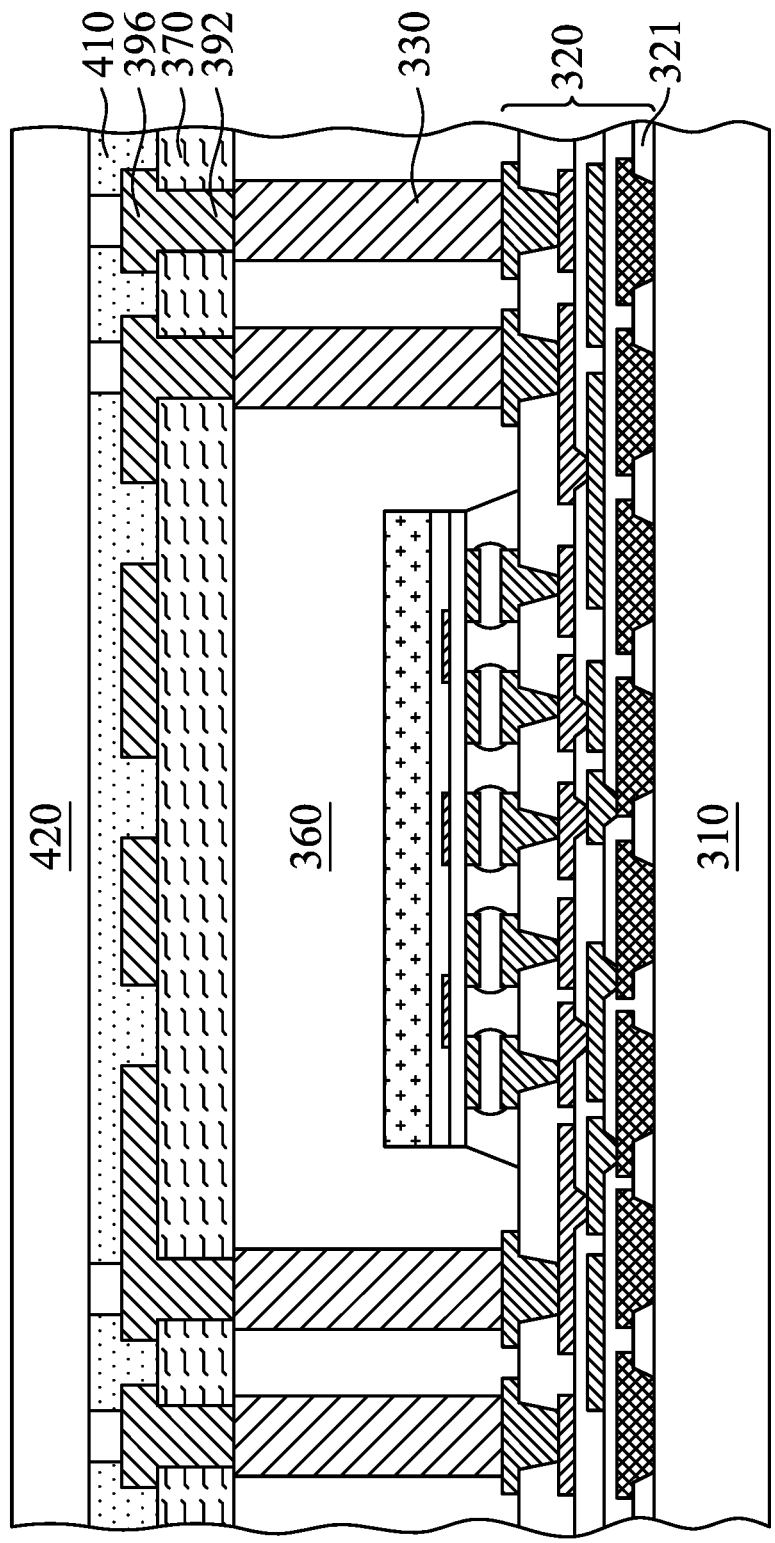

As shown in FIG. 3F, a carrier substrate 420 is bonded to the solder resist layer 410, in accordance with some embodiments. The carrier substrate 420 is configured to provide temporary mechanical and structural support during subsequent processing steps, in accordance with some embodiments. The carrier substrate 420 includes glass, silicon, silicon oxide, aluminum oxide, metal, a combination thereof, and/or the like, in accordance with some embodiments. The carrier substrate 420 includes a metal frame, in accordance with some embodiments.

Figure 3G:
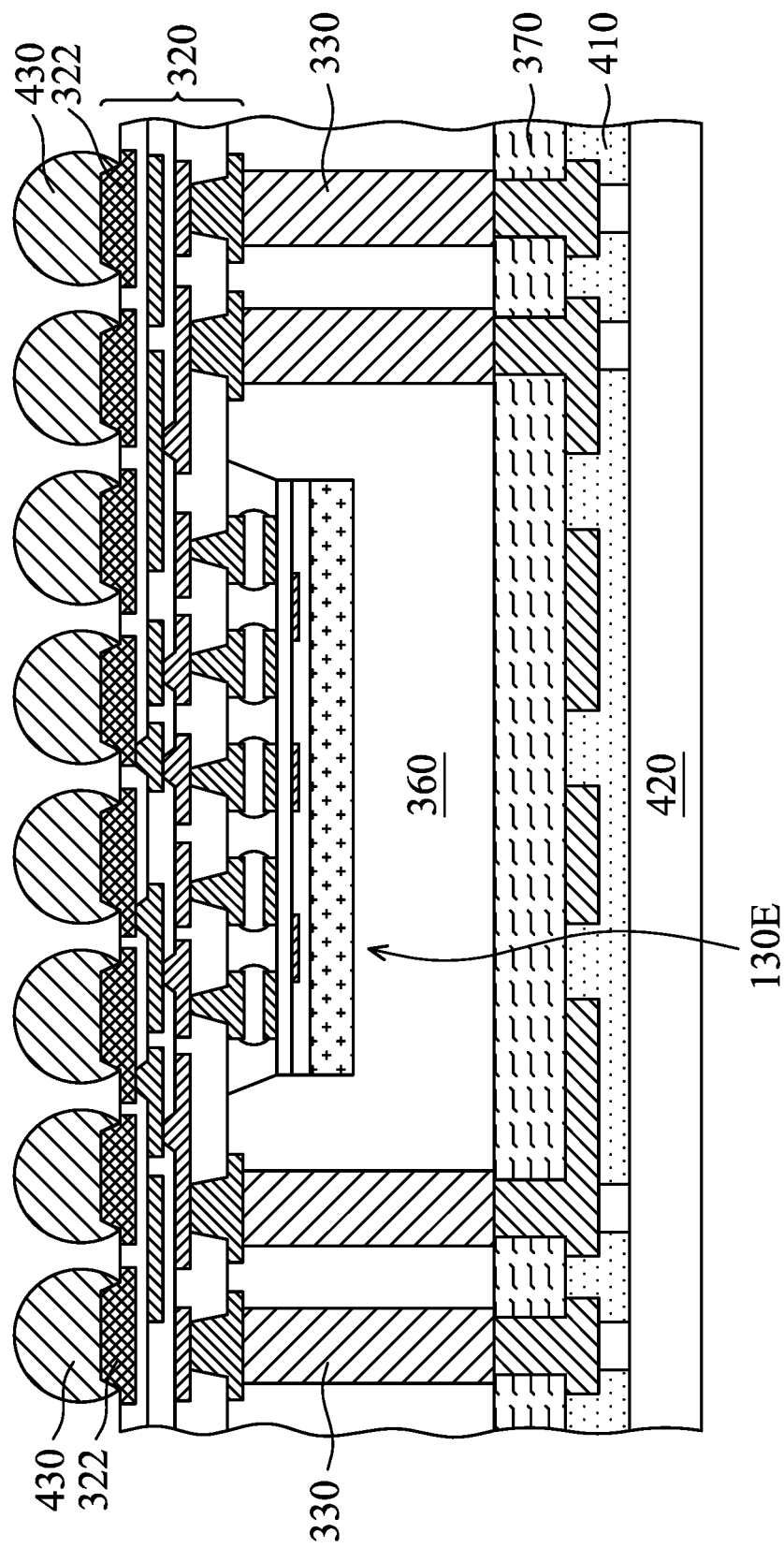

As shown in FIG. 3G, the carrier substrate 310 is removed, in accordance with some embodiments. The removal process is also referred to as a debonding process, in accordance with some embodiments. As shown in FIG. 3G, the redistribution structure 320 is filliped upside down, in accordance with some embodiments. As shown in FIG. 3G, the insulating layer 321 of the redistribution structure 320 is removed, in accordance with some embodiments. In some embodiments (not shown), the insulating layer 321 is partially removed to expose more surfaces of the conductive pads 322. The insulating layer 321 is (partially) removed by a dry etching process or a wet etch process, in accordance with some embodiments.

As shown in FIG. 3G, conductive bumps 430 are respectively formed over the conductive pads 322, in accordance with some embodiments. The redistribution structure 320 is between the conductive bumps 430 and the molding layer 360, in accordance with some embodiments. The conductive bumps 430 are made of a conductive material, such as a solder material (e.g., Sn, Ag, or Au), in accordance with some embodiments.

Figure 3H:
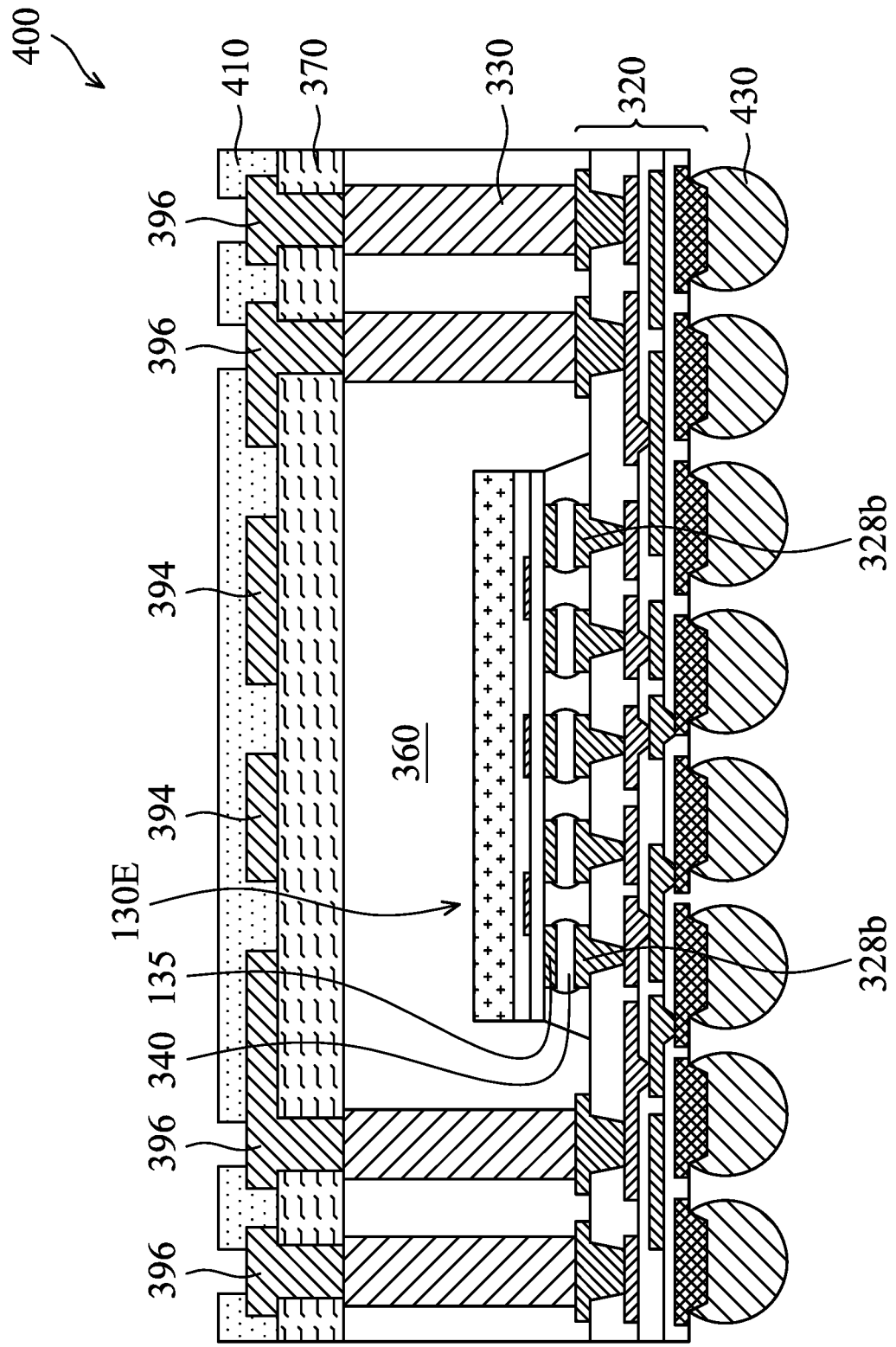

As shown in FIG. 3H, a debonding process is performed to remove the carrier substrate 420 from the solder resist layer 410, in accordance with some embodiments. As shown in FIG. 3H, a cutting process is performed to cut through the redistribution structure 320, the molding layer 360, the cap layer 370, and the solder resist layer 410 to form chip package structures 400, in accordance with some embodiments. For the sake of simplicity, FIG. 3H only shows one of the chip package structures 400, in accordance with some embodiments.

The method for forming the chip package structures 400 forms the cap layer 370 directly on the molding layer 360 without using conductive bumps, and therefore the size (e.g., the height) of the chip package structures 400 is reduced, in accordance with some embodiments.

Since the cap layer 370 and the molding layer 360 are made of different materials, the warpage of the chip package structure 400 may be reduced by adjusting thicknesses of the cap layer 370 and the molding layer 360. The suitable thickness ratio of the cap layer 370 to the molding layer 360 may be calculated by computer simulation.

Since the warpage of the chip package structure 400 is reduced, the reliability of the joints of the chip package structure 400 is improved, in accordance with some embodiments. The joints of the chip package structure 400 include the conductive layers 340, the conductive structures 135, and the conductive pad 328b, in accordance with some embodiments.

Figure 4:
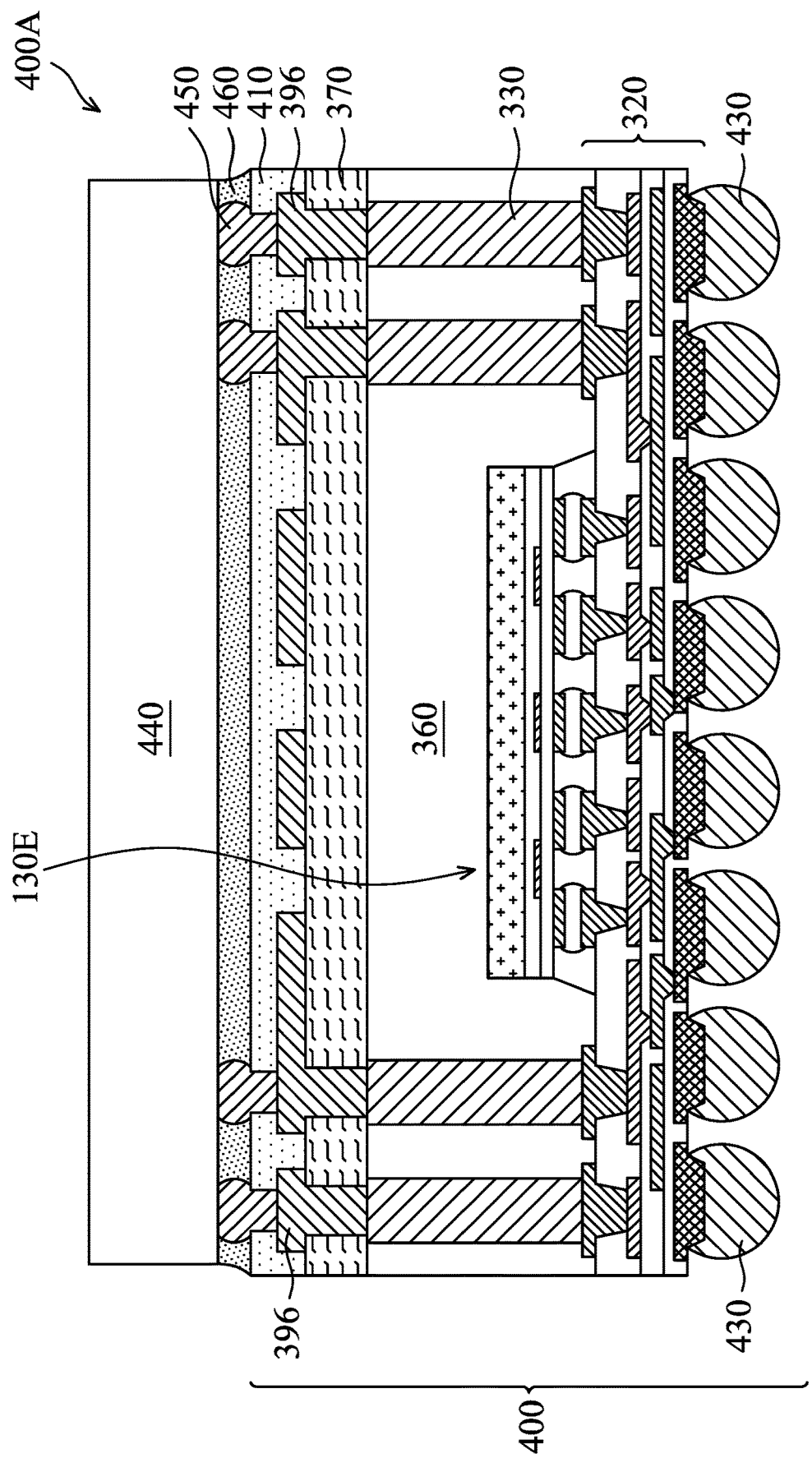
FIG. 4 is a cross-sectional view of a chip package structure, in accordance with some embodiments.

FIG. 4 is a cross-sectional view of a chip package structure 400A, in accordance with some embodiments. As shown in FIG. 4, the chip package structure 400A is similar to the chip package structure 400 of FIG. 3H, except that the chip package structure 400A further includes a package structure 440 bonded to the conductive pads 396 of the chip package structure 400 through conductive bumps 450, in accordance with some embodiments. The chip package structure 400A may further include an underfill layer 460 formed between the package structure 440 and the solder resist layer 410.

The formation of the package structure 440 and the underfill layer 460 includes, for example, bonding the package structure 440 to the conductive pads 396 of FIG. 3E; thereafter, forming the underfill layer 460 between the package structure 440 and the solder resist layer 410 of FIG. 3E; afterwards, performing the steps of FIGS. 3F-3G; and thereafter, as shown in FIG. 4, performing a cutting process to cut through the redistribution structure 320, the molding layer 360, the cap layer 370, the solder resist layer 410, and the underfill layer 460 to form chip package structures 400A, in accordance with some embodiments. For the sake of simplicity, FIG. 4 only shows one of the chip package structures 400A, in accordance with some embodiments.

The package structure 440 may include one or more chips (e.g., dynamic random access memory chips, not shown), one or more wiring substrates (not shown), redistribution structures (not shown), conductive bumps (not shown), or other suitable devices. The conductive bumps 450 are made of a solder material, such as Sn and Ag or another suitable conductive material (e.g., gold), in accordance with some embodiments. The underfill layer 460 is partially between the package structure 440 and the solder resist layer 410, in accordance with some embodiments.

Figure 5A:
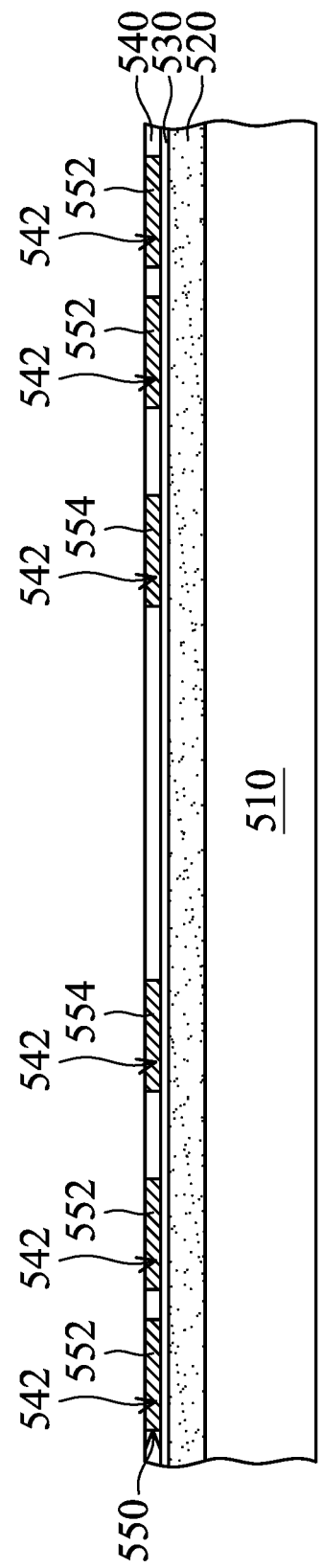
FIGS. 5A-5H are cross-sectional views of various stages of a process for forming a chip package structure, in accordance with some embodiments.

FIGS. 5A-5H are cross-sectional views of various stages of a process for forming a chip package structure, in accordance with some embodiments. As shown in FIG. 5A, a carrier substrate 510 is provided, in accordance with some embodiments. The carrier substrate 510 is configured to provide temporary mechanical and structural support during subsequent processing steps, in accordance with some embodiments.

The carrier substrate 510 includes glass, silicon, silicon oxide, aluminum oxide, metal, a combination thereof, and/or the like, in accordance with some embodiments. The carrier substrate 510 includes a metal frame, in accordance with some embodiments.

As shown in FIG. 5A, a solder resist layer 520 is formed over the carrier substrate 510, in accordance with some embodiments. The solder resist layer 520 is made of a polymer material, such as a photoresist material, in accordance with some embodiments. The solder resist layer 520 is formed using a coating process, in accordance with some embodiments.

As shown in FIG. 5A, a seed layer 530 is formed over the solder resist layer 520, in accordance with some embodiments. The seed layer 530 is formed using a deposition process, such as a physical vapor deposition process, in accordance with some embodiments. The seed layer 530 is made of titanium, copper, and/or another suitable conductive material.

As shown in FIG. 5A, a mask layer 540 is formed over the seed layer 530, in accordance with some embodiments. The mask layer 540 is made of a polymer material, such as a photoresist material, in accordance with some embodiments. The mask layer 540 is formed using a coating process, in accordance with some embodiments.

As shown in FIG. 5A, openings 542 are formed in the mask layer 540, in accordance with some embodiments. The openings 542 expose portions of the seed layer 530, in accordance with some embodiments. The openings 542 are formed using a photolithography process, in accordance with some embodiments.

As shown in FIG. 5A, a wiring layer 550 is formed in the openings 542 and over the seed layer 530, in accordance with some embodiments. The wiring layer 550 includes pad portions 552 and line portions 554, in accordance with some embodiments. The wiring layer 550 is made of a conductive material, such as copper, aluminum, or tungsten, in accordance with some embodiments. The wiring layer 550 is formed using a plating process, in accordance with some embodiments.

Figure 5B:
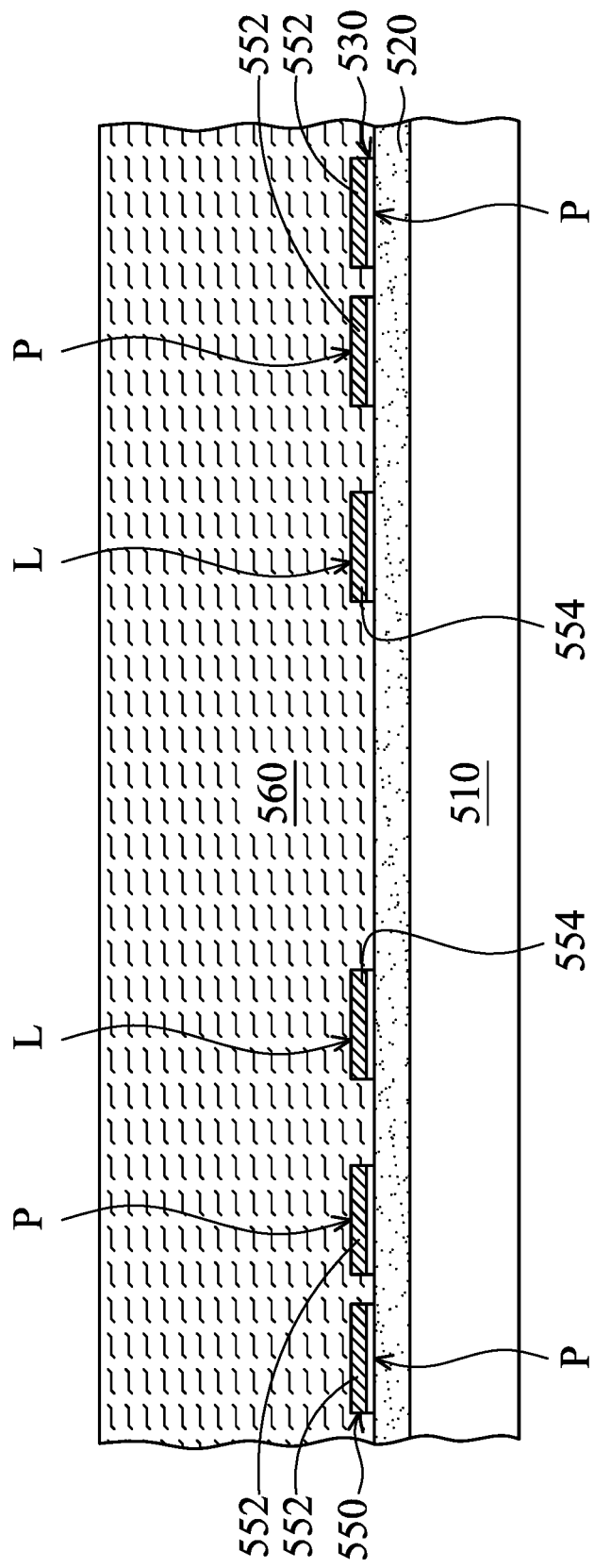

As shown in FIG. 5B, the mask layer 540 is removed, in accordance with some embodiments. In some embodiments, the mask layer 540 is removed using a photolithography process. Afterwards, as shown in FIG. 5B, the seed layer 530 originally covered by the mask layer 540 is removed, in accordance with some embodiments.

In some embodiments, the seed layer 530 originally covered by the mask layer 540 is removed using an etching process. The pad portions 552 and the seed layer 530 remaining under the pad portions 552 together form conductive pads P, in accordance with some embodiments. The line portions 554 and the seed layer 530 remaining under the line portions 554 together form conductive lines L, in accordance with some embodiments.

As shown in FIG. 5B, a substrate layer 560 is formed over the solder resist layer 520 and the wiring layer 550, in accordance with some embodiments. The wiring layer 550 is embedded in the substrate layer 560, in accordance with some embodiments. The substrate layer 560 is made of a polymer material, such as prepreg (PP) which includes fiber and epoxy resin or ABF (Ajinomoto Build up Film). The substrate layer 560 is formed using a lamination process, in accordance with some embodiments.

Figure 5C:
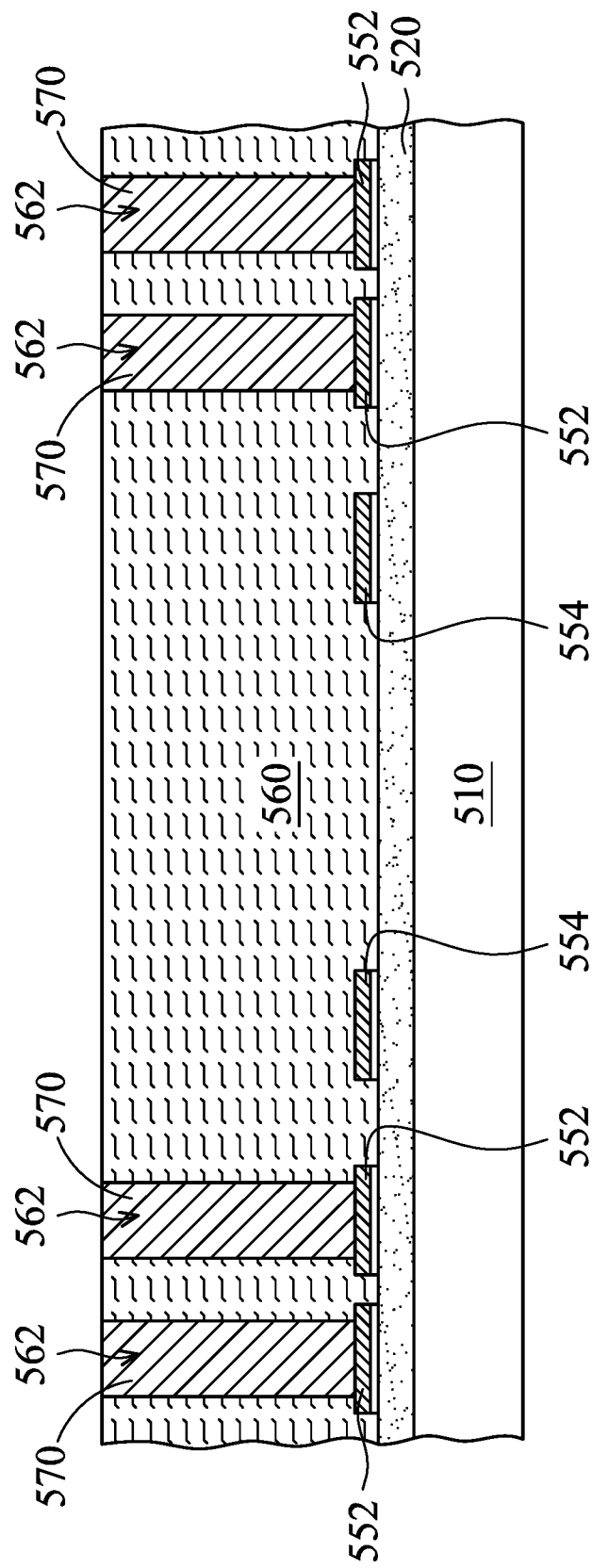

As shown in FIG. 5C, through holes 562 are formed in the substrate layer 560, in accordance with some embodiments. The through holes 562 respectively expose the pad portions 552, in accordance with some embodiments. The through holes 562 are formed using a laser drilling process, a dry etching process, or a wet etching process, in accordance with some embodiments.

As shown in FIG. 5C, conductive pillars 570 are formed in the through holes 562, in accordance with some embodiments. The conductive pillars 570 are made of copper (Cu), copper alloy, aluminum (Al), aluminum alloy, tungsten (W), tungsten alloy, titanium (Ti), titanium alloy, tantalum (Ta) or tantalum alloy, in accordance with some embodiments. The conductive pillars 570 are formed using a plating process, in accordance with some embodiments.

Figure 5D:
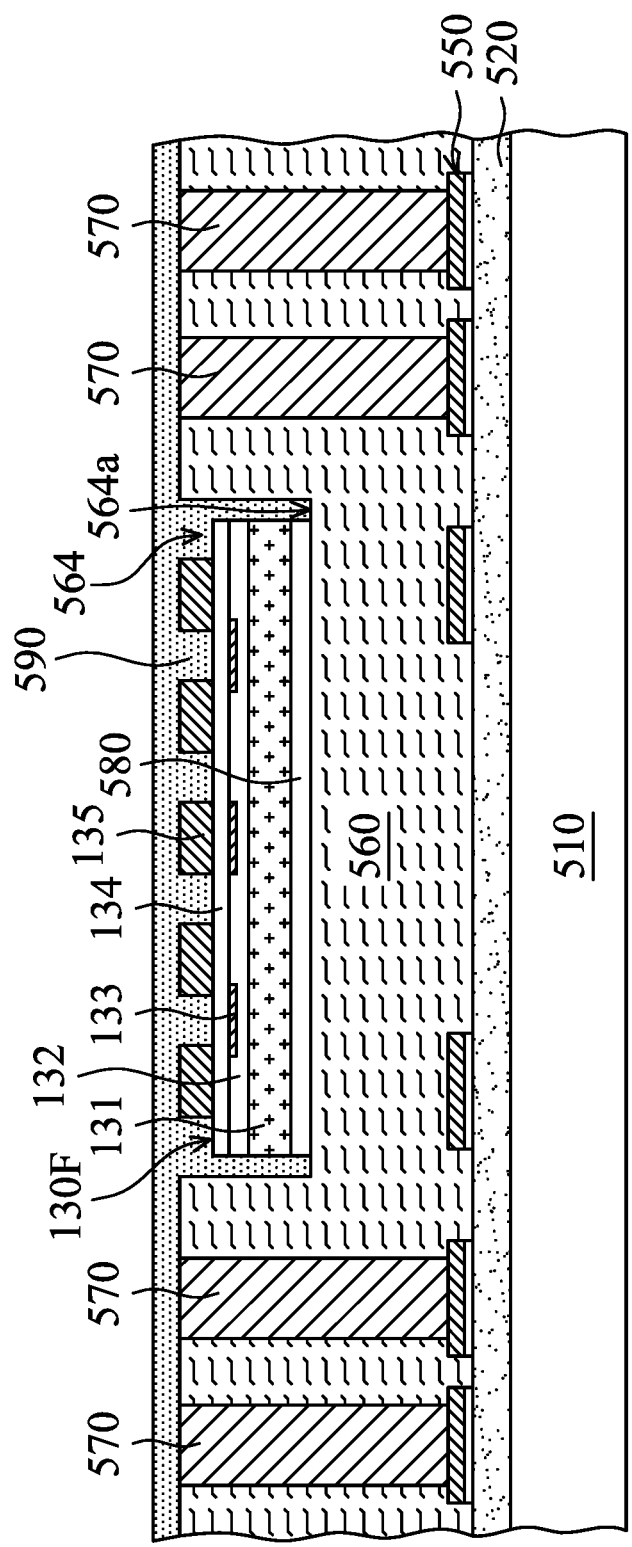

As shown in FIG. 5D, a portion of the substrate layer 560 is removed to form a recess 564 in the substrate layer 560, in accordance with some embodiments. The recess 564 does not pass through the substrate layer 560, in accordance with some embodiments. The recess 564 has a bottom surface 564a, in accordance with some embodiments. The recess 564 is formed using a laser drilling process, a dry etching process, or a wet etching process, in accordance with some embodiments. As shown in FIG. 5D, a chip 130F is disposed in the recess 564, in accordance with some embodiments. The substrate layer 560 is partially between the chip 130F and the carrier substrate 510, in accordance with some embodiments.

The chip 130F is similar to or the same as the chip 130A of FIG. 1A, in accordance with some embodiments. The chip 130F includes a semiconductor substrate 131, a dielectric layer 132, conductive pads 133, an interconnection layer 134, and conductive structures 135, which are respectively similar to or the same as the semiconductor substrate 131, the dielectric layer 132, the conductive pads 133, the interconnection layer 134, and the conductive structures 135 of the chip 130A of FIG. 1A, in accordance with some embodiments. Therefore, the detailed description of the chip 130F is not repeated herein.

In some embodiments, the chip 130F is bonded to the bottom surface 564a through an adhesive layer 580, in accordance with some embodiments. The adhesive layer 580 is between the chip 130F and the substrate layer 560, in accordance with some embodiments. The adhesive layer 580 is made of a polymer material, a heat dissipation material (e.g., a silver paste, a copper paste, or a tin paste), or another suitable material, in accordance with some embodiments.

As shown in FIG. 5D, a molding layer 590 is formed in the recess 564 and over the substrate layer 560 and the conductive pillars 570, in accordance with some embodiments. The molding layer 590 covers the entire chip 130F, in accordance with some embodiments. The molding layer 590 is made of a polymer material, in accordance with some embodiments. The molding layer 590 and the substrate layer 560 are made of different materials, in accordance with some embodiments.

Figure 5E:
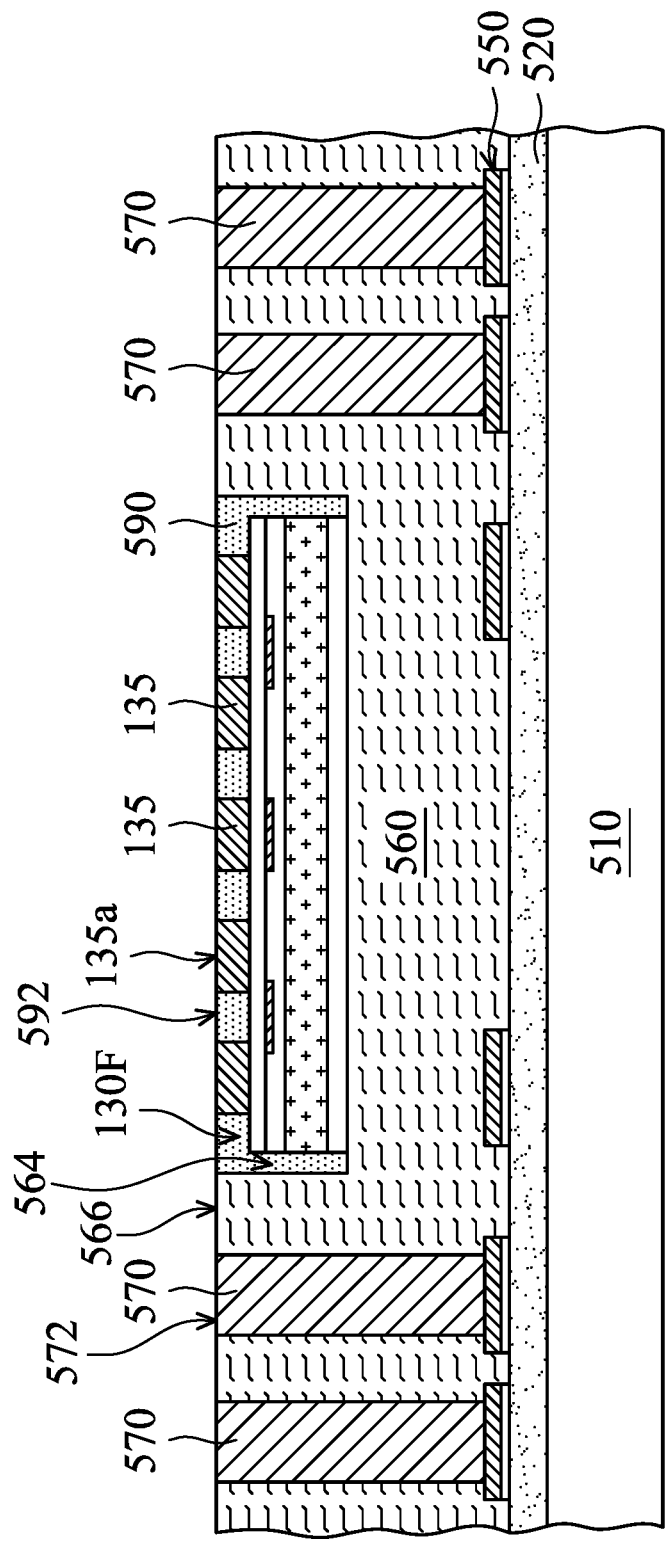

As shown in FIG. 5E, a thinning process is performed over the molding layer 590 until the conductive structures 135 of the chip 130F and the conductive pillars 570 are exposed, in accordance with some embodiments. The thinning process includes a chemical mechanical polishing process, in accordance with some embodiments.

In some embodiments, top surfaces 135a of the conductive structures 135, a top surface 592 of the molding layer 590, a top surface 566 of the substrate layer 560, and top surfaces 572 of the conductive pillars 570 are substantially coplanar. The entire chip 130F is in the recess 564, in accordance with some embodiments.

Figure 5F:
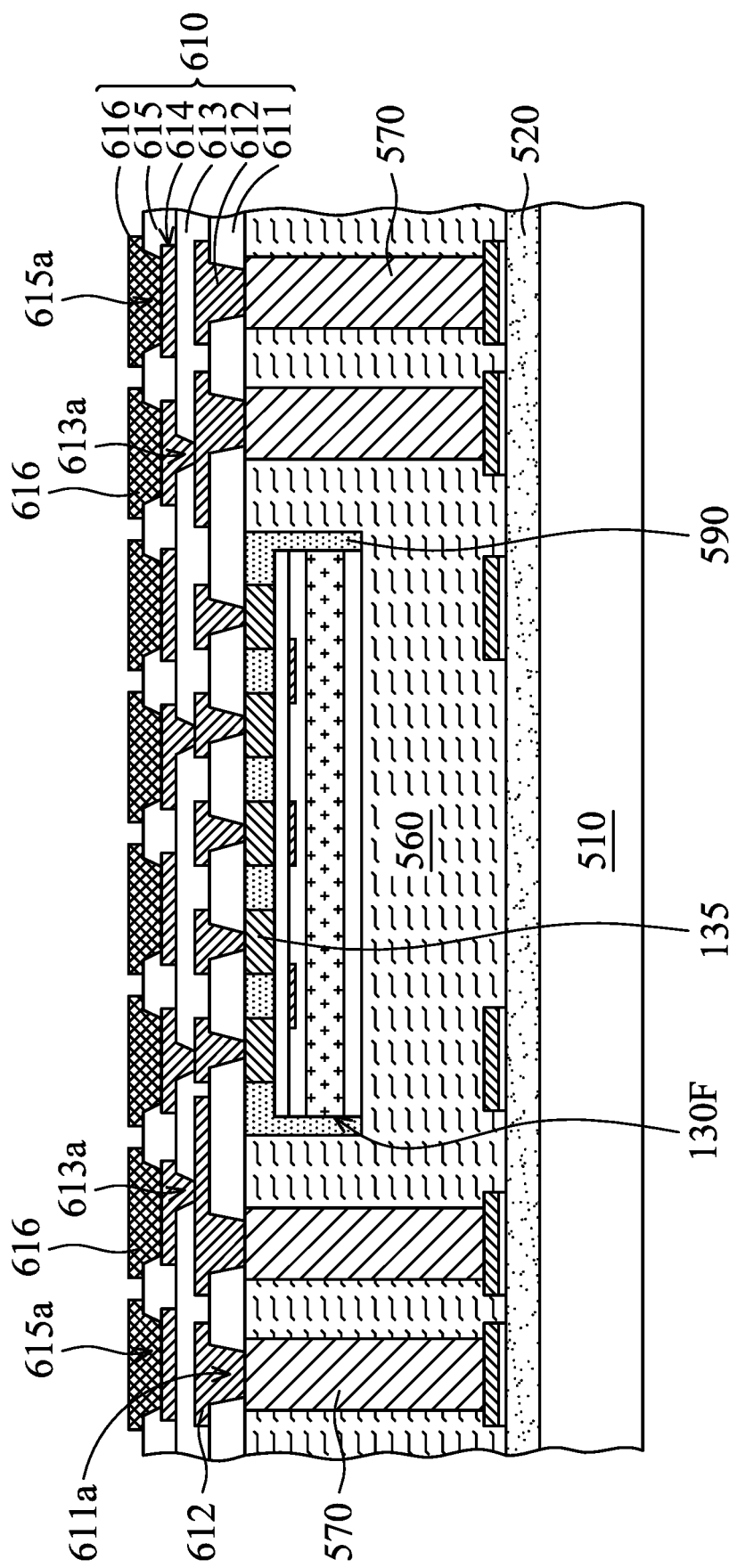

As shown in FIG. 5F, a redistribution structure 610 is formed over the substrate layer 560, the conductive pillars 570, the molding layer 590, and the chip 130F, in accordance with some embodiments. The formation of the redistribution structure 610 includes forming an insulating layer 611 over the substrate layer 560, the conductive pillars 570, the molding layer 590, and the chip 130F; forming a wiring layer 612 over the insulating layer 611 and in through holes 611a of the insulating layer 611; forming an insulating layer 613 over the insulating layer 611 and the wiring layer 612; forming a wiring layer 614 over the insulating layer 613 and in through holes 613a of the insulating layer 613; forming an insulating layer 615 over the insulating layer 613 and the wiring layer 614; and forming conductive pads 616 over the insulating layer 615 and in through holes 615a of the insulating layer 615, in accordance with some embodiments. The conductive pad 616 may include an under-bump metallization layer, in accordance with some embodiments. The conductive pad 616 includes a conductive material such as copper, copper alloys, titanium, titanium alloy, or another suitable material.

In some embodiments, the wiring layer 612 is in direct contact with the conductive pillars 570 and the conductive structures 135. The wiring layers 612 and 614 and the conductive pads 616 are electrically connected to each other, in accordance with some embodiments.

The insulating layers 611, 613, and 615 are made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The wiring layers 612 and 614 and the conductive pads 616 are made of a conductive material, such as metal (e.g. copper, aluminum, or tungsten), in accordance with some embodiments.

Figure 5G:
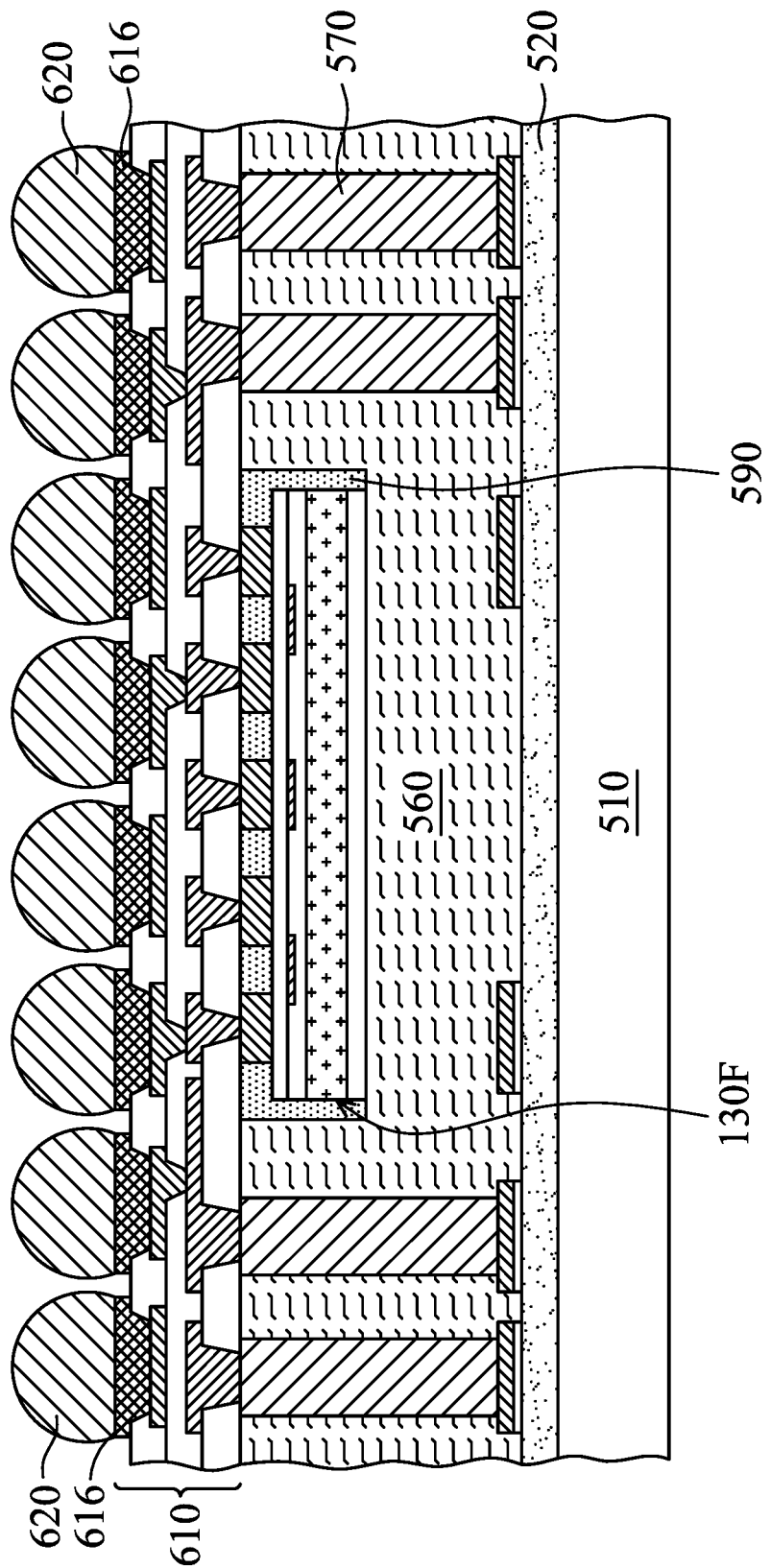

As shown in FIG. 5G, conductive bumps 620 are formed over the conductive pads 616, in accordance with some embodiments. The redistribution structure 610 is partially between the conductive bumps 620 and the molding layer 590, in accordance with some embodiments. The redistribution structure 610 is partially between the conductive bumps 620 and the substrate layer 560, in accordance with some embodiments. The conductive bumps 620 are made of a conductive material, such as a solder material (e.g., Sn, Ag, or Au), in accordance with some embodiments.

Figure 5H:
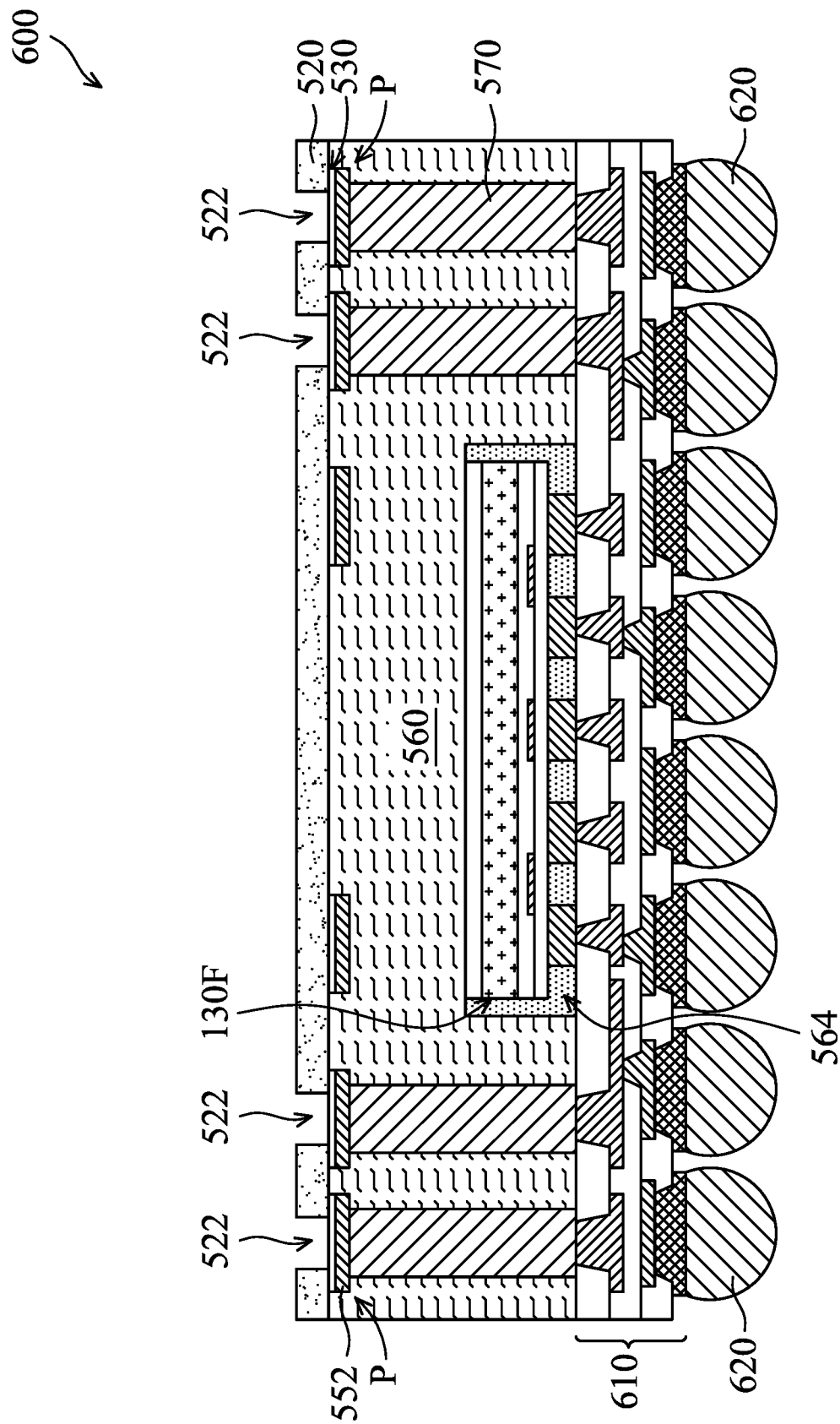

As shown in FIG. 5H, the carrier substrate 510 is removed, in accordance with some embodiments. As shown in FIG. 5H, the redistribution structure 610 is flipped upside down, in accordance with some embodiments. As shown in FIG. 5H, portions of the solder resist layer 520 are removed to form openings 522 in the solder resist layer 520, in accordance with some embodiments.

The openings 522 expose the conductive pads P, in accordance with some embodiments. The openings 522 are formed using a dry etching process or a wet etching process, in accordance with some embodiments. In some embodiments, the solder resist layer 520 is made of a photoresist material, and the openings 522 are formed using a photolithography process. In some embodiments (not shown), the seed layer 530 under the openings 522 is partially removed after the openings 522 are formed.

Afterwards, as shown in FIG. 5H, a cutting process is performed to cut through the solder resist layer 520, the substrate layer 560, and the redistribution structure 610 to form chip package structures 600, in accordance with some embodiments. For the sake of simplicity, FIG. 5H only shows one of the chip package structures 600, in accordance with some embodiments.

In the chip package structures 600, the chip 130F is entirely in the recess 564 of the substrate layer 560, and therefore the size (e.g., the height) of the chip package structures 600 is reduced, in accordance with some embodiments.

Figure 6:
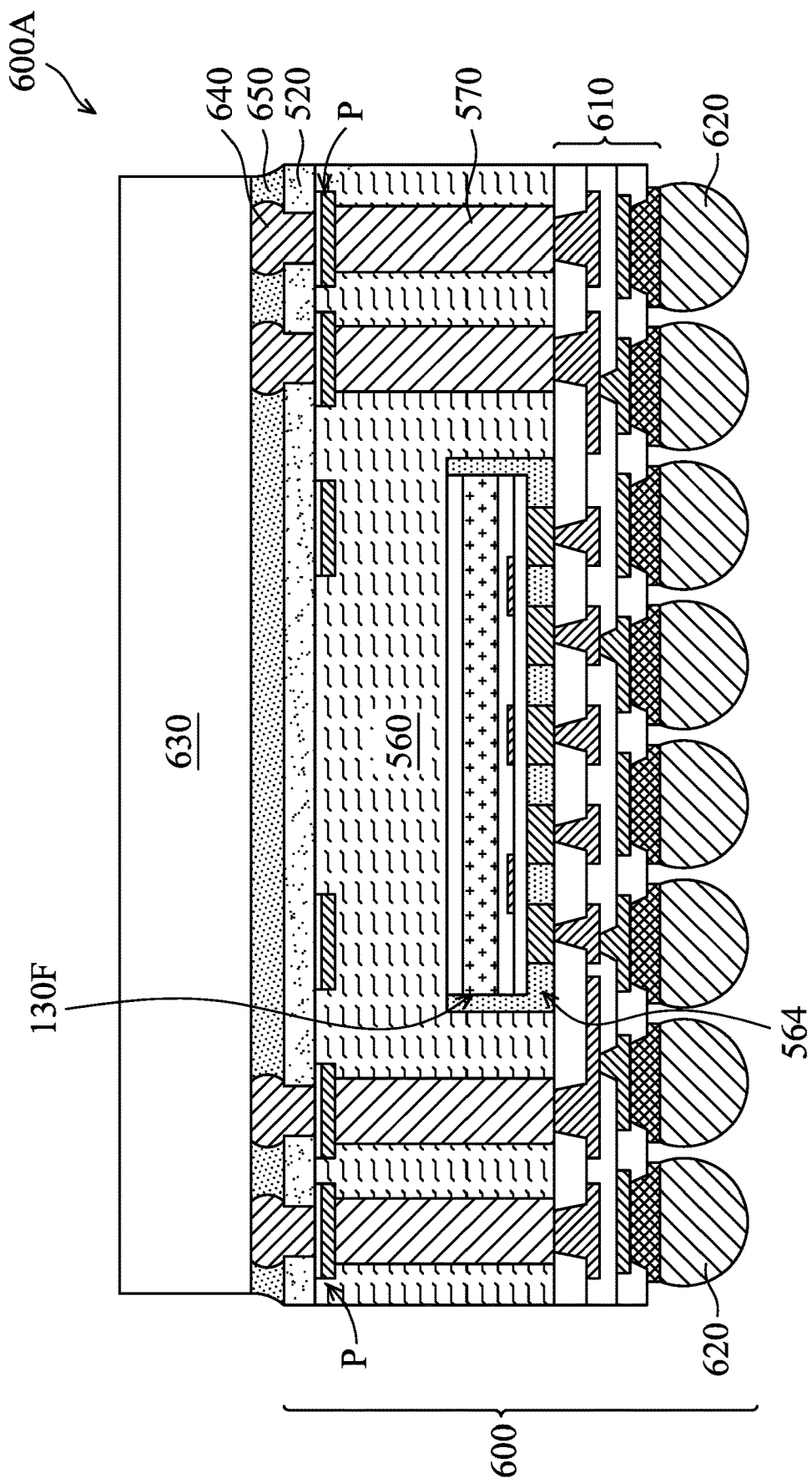
FIG. 6 is a cross-sectional view of a chip package structure, in accordance with some embodiments.

FIG. 6 is a cross-sectional view of a chip package structure 600A, in accordance with some embodiments. As shown in FIG. 6, the chip package structure 600A is similar to the chip package structure 600 of FIG. 5H, except that the chip package structure 600A further includes a package structure 630 bonded to the conductive pads P of the chip package structure 600 through conductive bumps 640, in accordance with some embodiments. The chip package structure 600A may further include an underfill layer 650 formed between the package structure 630 and the solder resist layer 520.

The formation of the package structure 630 and the underfill layer 650 includes, for example, bonding the package structure 630 to the conductive pads P of FIG. 5H before the cutting process is performed; thereafter, forming the underfill layer 650 between the package structure 630 and the solder resist layer 520 of FIG. 5H before the cutting process is performed; and thereafter, as shown in FIG. 6, performing a cutting process to cut through the underfill layer 650, the solder resist layer 520, the substrate layer 560, and the redistribution structure 610 to form chip package structures 600A, in accordance with some embodiments. For the sake of simplicity, FIG. 6 only shows one of the chip package structures 600A, in accordance with some embodiments.

The package structure 630 may include one or more chips (not shown), one or more wiring substrates (not shown), redistribution structures (not shown), conductive bumps (not shown), or other suitable devices. The conductive bumps 640 are made of a solder material, such as Sn and Ag or another suitable conductive material (e.g., gold), in accordance with some embodiments. The underfill layer 650 is partially between the package structure 630 and the solder resist layer 520, in accordance with some embodiments.

In accordance with some embodiments, a method for forming a chip package structure is provided. The method includes forming a conductive pad over a carrier substrate, forming a substrate layer over the carrier substrate, wherein the conductive pad is embedded in the substrate layer, forming a conductive pillar electrically connected to the conductive pad, disposing a chip in the substrate layer, and forming a molding layer surrounding the chip.

In accordance with some embodiments, a method for forming a chip package structure is provided. The method includes forming a conductive pad over a carrier substrate, forming a substrate layer over the carrier substrate, forming a conductive pillar in the substrate layer, disposing a chip on the substrate layer, forming a molding layer on the substrate layer, and forming a redistribution structure over the chip.

In accordance with some embodiments, a method for forming a chip package structure is provided. The method includes forming a solder resist layer on a carrier substrate, forming a conductive pad over the solder resist layer, forming a substrate layer over the carrier substrate, forming a conductive pillar above the conductive pad, dispose a chip in the substrate layer, forming a molding layer to cover the chip, and forming a redistribution structure over the molding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package structure, comprising:
   forming a conductive pad over a carrier substrate;
   forming a substrate layer over the carrier substrate, wherein the conductive pad is embedded in the substrate layer;
   forming a conductive pillar electrically connected to the conductive pad;
   disposing a chip in the substrate layer; and
   forming a molding layer surrounding the chip.

2. The method for forming the chip package structure as claimed in claim 1, wherein the substrate layer comprises fibers.

3. The method for forming the chip package structure as claimed in claim 1, further comprising:
   forming a redistribution structure over the substrate layer, the conductive pillar, the molding layer, and the chip; and
   removing the carrier substrate.

4. The method for forming the chip package structure as claimed in claim 1, wherein a bottom surface of the chip is in contact with the substrate layer.

5. The method for forming the chip package structure as claimed in claim 1, wherein the conductive pad is surrounded by the substrate layer.

6. The method for forming the chip package structure as claimed in claim 1, further comprising forming a solder resist layer between the conductive pad and the carrier substrate.

7. A method for forming a chip package structure, comprising:
   forming a conductive pad over a carrier substrate;
   forming a substrate layer over the carrier substrate;
   forming a conductive pillar in the substrate layer;
   disposing a chip on the substrate layer;
   forming a molding layer on the substrate layer; and
   forming a redistribution structure over the chip.

8. The method for forming the chip package structure as claimed in claim 7, further comprising:
   forming a recess in the substrate layer; and
   disposing the chip in the recess.

9. The method for forming the chip package structure as claimed in claim 8, wherein a thickness of the chip is less than a depth of the recess.

10. The method for forming the chip package structure as claimed in claim 8, wherein a top surface of the chip is lower than a top surface of the substrate layer.

11. The method for forming the chip package structure as claimed in claim 8, further comprising forming a conductive structure over the chip and in the recess.

12. The method for forming the chip package structure as claimed in claim 7, further comprising thinning the molding layer until exposing the conductive pillar.

13. The method for forming the chip package structure as claimed in claim 7, wherein the redistribution structure is wider than the chip.

14. The method for forming the chip package structure as claimed in claim 7, further comprising forming a solder resist layer between the conductive pad and the carrier substrate.

15. The method for forming the chip package structure as claimed in claim 14, further comprising:
   removing the carrier substrate; and
   removing a portion of the solder resist layer to expose the conductive pad.

16. The method for forming the chip package structure as claimed in claim 15, further comprising forming a conductive bump in the solder resist layer and electrically connected to the conductive pad.

17. A method for forming a chip package structure, comprising:
   forming a solder resist layer on a carrier substrate;
   forming a conductive pad over the solder resist layer;
   forming a substrate layer over the carrier substrate;
   forming a conductive pillar above the conductive pad;
   dispose a chip in the substrate layer;
   forming a molding layer to cover the chip; and
   forming a redistribution structure over the molding layer.

18. The method for forming the chip package structure as claimed in claim 17, further comprising
   removing the carrier substrate; and
   removing a portion of the solder resist layer to expose the conductive pad.

19. The method for forming the chip package structure as claimed in claim 18, further comprising:
   forming a conductive bump in the solder resist layer and in contact with the conductive pad; and
   disposing a package structure on the solder resist layer and in contact with the conductive bump.

20. The method for forming the chip package structure as claimed in claim 19, further comprising forming an underfill layer between the solder resist layer and the package structure.

* * * * *